United States Patent
Roh et al.

(10) Patent No.: US 9,853,073 B2
(45) Date of Patent: Dec. 26, 2017

(54) IMAGE SENSOR FOR PRODUCING VIVID COLORS AND METHOD OF MANUFACTURING THE SAME

(71) Applicant: SAMSUNG ELECTRONICS CO., LTD., Suwon-si (KR)

(72) Inventors: Sookyoung Roh, Seoul (KR);
Sunghyun Nam, Yongi-si (KR);
Seokho Yun, Hwaseong-si (KR);
Hongkyu Park, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 170 days.

(21) Appl. No.: 14/677,281

(22) Filed: Apr. 2, 2015

(65) Prior Publication Data

US 2016/0054172 A1   Feb. 25, 2016

(30) Foreign Application Priority Data

Aug. 22, 2014   (KR) .................. 10-2014-0109964

(51) Int. Cl.
*G01J 1/04* (2006.01)
*H01L 27/146* (2006.01)

(52) U.S. Cl.
CPC .. *H01L 27/14621* (2013.01); *H01L 27/14627* (2013.01); *H01L 27/14629* (2013.01); *H01L 27/14685* (2013.01)

(58) Field of Classification Search
CPC .............................. G01J 1/0414; G01J 1/0488
USPC ........................................................ 250/226
See application file for complete search history.

(56) References Cited

U.S. PATENT DOCUMENTS

| | | | |
|---|---|---|---|
| 6,882,364 B1* | 4/2005 | Inuiya | H04N 9/045 348/237 |
| 7,110,034 B2* | 9/2006 | Suda | H01L 27/14603 257/294 |
| 8,208,052 B2 | 6/2012 | Hiramoto et al. | |
| 8,289,422 B2 | 10/2012 | Hiramoto et al. | |
| 8,294,076 B2 | 10/2012 | Nishiwaki et al. | |
| 8,384,818 B2 | 2/2013 | Hiramoto et al. | |
| 2002/0135825 A1* | 9/2002 | Lee | G02B 5/1814 358/509 |
| 2010/0019129 A1* | 1/2010 | Ishigaki | H01L 27/14621 250/208.1 |
| 2012/0212656 A1 | 8/2012 | Hiramoto et al. | |
| 2014/0055649 A1 | 2/2014 | Hiramoto et al. | |

FOREIGN PATENT DOCUMENTS

| | | |
|---|---|---|
| JP | 2013143738 A | 7/2013 |
| KR | 10-0541028 B1 | 1/2006 |
| KR | 10-0628230 B1 | 9/2006 |

* cited by examiner

*Primary Examiner* — Seung C Sohn
(74) *Attorney, Agent, or Firm* — Sughrue Mion, PLLC

(57) ABSTRACT

An image sensor and a method of manufacturing the same are provided. The image sensor includes a photoelectric conversion layer; a color filter disposed on the photoelectric conversion layer; a low refractive index layer disposed on the color filter; a beam splitter disposed within the low refractive index layer; and a lens layer disposed on the low refractive index layer and covering the beam splitter. The beam splitter extends in a diagonal direction of a pixel area of the color filter, in a plan view.

27 Claims, 22 Drawing Sheets

(a)

(b)

IMAGE SENSOR FOR PRODUCING VIVID COLORS AND METHOD OF MANUFACTURING THE SAME

RELATED APPLICATION

This application claims priority from Korean Patent Application No. 10-2014-0109964, filed on Aug. 22, 2014, in the Korean Intellectual Property Office, the disclosure of which is incorporated herein in its entirety by reference.

BACKGROUND

1. Field

Apparatuses and methods consistent with exemplary embodiments relate to methods and apparatuses for an image sensor, and more particularly, to an image sensor for producing vivid colors and a method of manufacturing the same.

2. Description of the Related Art

Color filters are used in image sensors, such as charge-coupled device (CCD) image sensors or complementary metal-oxide semiconductor (CMOS) image sensors, or in display devices.

An organic dye color filter may receive incident light and transmit the desired color spectrum components, for example, red, blue, and green light, while absorbing other components of the incident light. For each unit pixel, about two-thirds of the energy of light that is incident on the color filter may be lost during this process.

Each pixel of a color image sensor typically includes an organic dye color filter disposed on a detector for photoelectric conversion. The organic dye color filter is formed in a Bayer pattern. After obtaining a color mosaic image by using the organic dye color filter, the image is processed, and thus, an original color image is obtained.

Although organic dye color filters are widely used in color image sensors, such organic dye color filters absorb light in all but one certain wavelength band. Therefore, using such color image sensors may cause a relatively large amount of light energy loss and a low light efficiency.

SUMMARY

One or more exemplary embodiments provide an image sensor in which light efficiency may be improved by reducing loss of incident light and vivid colors may be produced.

One or more exemplary embodiments may provide a method of manufacturing an image sensor.

Additional exemplary aspects and advantages will be set forth in part in the description which follows and, in part, will be apparent from the description, or may be learned by practice of the presented embodiments.

According to an aspect of an exemplary embodiment, an image sensor that produces vivid colors includes a photoelectric conversion layer; a color filter on the photoelectric conversion layer; a low refractive index layer on the color filter; a beam splitter included in the low refractive index layer; and a lens layer provided on the low refractive index layer and covering the beam splitter. The beam splitter extends in a diagonal direction of a pixel area of the color filter, in a plan view.

The beam splitter may include a first beam splitter extending in a diagonal direction of a red sub-pixel included in a unit pixel of the image sensor and a second beam splitter extending in a diagonal direction of a blue sub-pixel included in the unit pixel of the image sensor.

The first beam splitter and the second beam splitter may be formed in areas of the low refractive index layer corresponding to the red sub-pixel and the blue sub-pixel, respectively.

The beam splitter may include a first high refractive index portion in the area corresponding to the red sub-pixel and a second high refractive index portion in the area corresponding to the blue sub-pixel. Refractive indexes of the high refractive index portions may be higher than a refractive index of the low refractive index layer.

The beam splitter may include two first high refractive index portions in the area corresponding to the red sub-pixel and two second high refractive index portions in the area corresponding to the blue sub-pixel. Refractive indexes of the first and second high refractive index portions may be higher than a refractive index of the low refractive index layer.

Specifications of the first high refractive index portions in the area corresponding to the red sub-pixel may be different from specifications of the second high refractive index portions in the area corresponding to the blue sub-pixel.

Specifications of the two first high refractive index portions in the area corresponding to the red sub-pixel may be identical. Specifications of the two second high refractive index portions in the area corresponding to the blue sub-pixel may be identical.

The specifications of the two first high refractive index portions in the area corresponding to the red sub-pixel may be different from the specifications of the two second high refractive index portions in the area corresponding to the blue sub-pixel.

An area corresponding to a green sub-pixel of the unit pixel may be removed from the color filter.

The beam splitter may further include at least one third beam splitter comprising a high refractive index portion in an area of the low refractive index layer which corresponds to a green sub-pixel of the unit pixel. The area corresponding to the green sub-pixel of the unit pixel may be removed from the color filter.

The first and second beam splitters may extend to an area of the low refractive index layer which corresponds to the green sub-pixel of the unit pixel.

Sub-pixels in the unit pixel may be covered by a single lens layer.

The low refractive index layer may include first and second low refractive index layers that are sequentially stacked, and the beam splitter may be disposed in the second low refractive index layer.

According to an aspect of another exemplary embodiment, an image sensor includes a unit pixel in which red, green, and blue sub-pixels form a Bayer pattern; at least one first beam splitter disposed in an area corresponding to a red sub-pixel and extending in a diagonal direction of the red sub-pixel, in a plan view; and at least one second beam splitter disposed in an area corresponding to a blue sub-pixel and extending in a diagonal direction of the blue sub-pixel.

The at least one first beam splitter may include one or two first beam splitters, and the at least one second beam splitter may include one or two second beam splitters.

Each of the at least one first beam splitter and the at least one second beam splitter may extend to an area corresponding to the green sub-pixel.

At least one third beam splitter may be provided in an area corresponding to the green sub-pixel.

According to an aspect of another exemplary embodiment, a method of manufacturing an image sensor includes forming a low refractive index layer on a lower layer including a color filter; forming a beam splitter in the low refractive index layer; and forming a lens layer covering the beam splitter, on the low refractive index layer. The beam splitter is formed in a diagonal direction of a pixel area of the color filter, in a plan view.

The forming of the low refractive index layer may include forming a first low refractive index layer on the lower layer; and forming a second low refractive index layer on the first low refractive index layer.

The forming of the beam splitter in the low refractive index layer may include forming at least one trench in the low refractive index layer; and filling the at least one trench with a high refractive index layer that has a higher refractive index than the low refractive index layer.

The forming of the at least one trench may include forming at least one first trench an area of the low refractive index layer corresponding to a red sub-pixel and forming at least one second trench in an area of the low refractive index layer corresponding a blue sub-pixel included in a unit pixel of the image sensor. The at least one first trench formed in the area which corresponds to the red sub-pixel and the at least one second trench formed in the area which corresponds to the blue sub-pixel may be respectively formed in a diagonal direction of the red sub-pixel and a diagonal direction of the blue sub-pixel.

The at least one first trench may include one or two first trenches and the at least one second trench may include one or two second trenches.

The at least one first trench formed in the area that corresponds to the red sub-pixel and the at least one second trench formed in the area that corresponds to the blue sub-pixel may have different specifications.

At least one third trench may be formed in a green sub-pixel included in the unit pixel. The color filter may be removed from an area corresponding to the green sub-pixel.

The at least one first trench and the at least one second trench may each extend to an area of the low refractive index layer which corresponds to a green sub-pixel included in the unit pixel.

BRIEF DESCRIPTION OF THE DRAWINGS

These and/or other exemplary aspects and advantages will become apparent and more readily appreciated from the following description of exemplary embodiments, taken in conjunction with the accompanying drawings in which.

DETAILED DESCRIPTION

Figure 1:
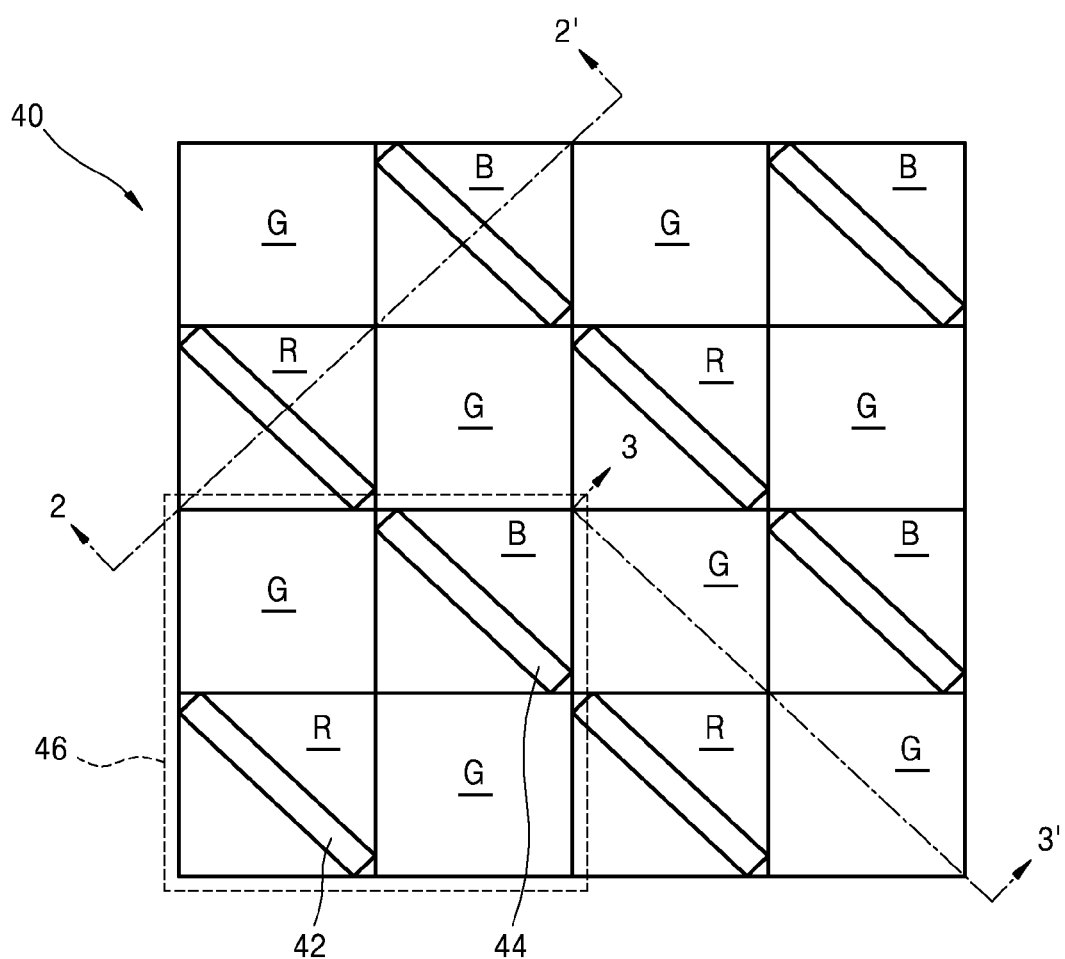
FIG. 1 is a plan view of an image sensor according to an exemplary embodiment.

Hereinafter, an image sensor for producing vivid colors and a method of manufacturing the same will be described in detail with reference to the accompanying drawings. Sizes and thicknesses of layers or components in the drawings are exaggerated for clarity.

FIG. 1 is a plan view of an image sensor according to an exemplary embodiment.

Referring to FIG. 1, an image sensor 40 that may produce vivid colors according to an exemplary embodiment (hereinafter, referred to as "first image sensor 40") includes a plurality of unit pixels. A unit pixel 46 includes one red sub-pixel R, one blue sub-pixel B, and two green sub-pixels G. An array of the four sub-pixels (R, G, and B) included in each of the unit pixels 46 may form a Bayer pattern. A first beam splitter 42 is provided in the red sub-pixel R. A second beam splitter 44 is provided in the blue sub-pixel B. The first and second beam splitters 42 and 44 are exemplary means for splitting light and may be parallel to each other. Other light splitting means may be used as would be understood by one of skill in the art. The first and second beam splitters 42 and 44 are respectively disposed along diagonal directions of the red and blue sub-pixels R and B. The first and second beam splitters 42 and 44 are parallel to each other and are arranged in a diagonal direction of the red sub-pixel R and a diagonal direction of the blue sub-pixel B, respectively. Respective sizes of the first and second beam splitters 42 and 44 (for example, a length of a diagonal line and a thickness in a direction perpendicular to the diagonal line) may be the same or different. The first and second beam splitters 42 and 44 may be high refractive index layers that have higher refractive indexes than a material surrounding each of the first and second beam splitters 42 and 44. For example, the first and second beam splitters 42 and 44 may each be a $TiO_2$ layer or a $SiN_x$ layer.

A lens layer is provided on the unit pixel 46 but is not illustrated in FIG. 1 for convenience.

Figure 2:
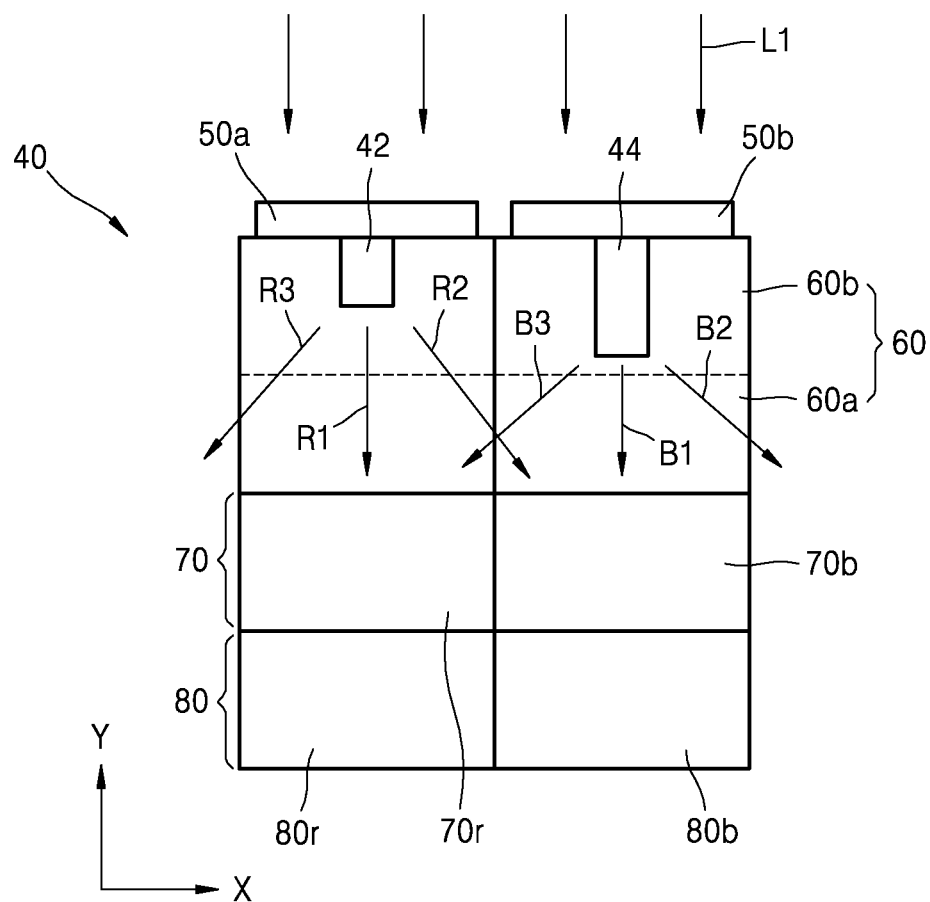
FIG. 2 is a cross-sectional view of FIG. 1 cut along the line 2-2' of FIG. 1.

Referring to FIG. 2, the first image sensor 40 includes a photoelectric conversion layer 80, a color filter layer 70, and a low refractive index layer 60 that are sequentially stacked. The photoelectric conversion layer 80 includes an R area 80r that corresponds to the red sub-pixel R and a B area 80b that corresponds to the blue sub-pixel B. The photoelectric conversion layer 80 converts light incident thereon into an electric current. The current includes image information and is transmitted to a signal processing circuit unit (not shown) that is connected to the photoelectric conversion layer 80. The color filter layer 70 includes an R area 70r that corresponds to the red sub-pixel R and a B area 70b that corresponds to the blue sub-pixel B. The R area 70r and the B area 70b of the color filter layer 70 are respectively disposed on the R area 80r and the B area 80b of the photoelectric conversion layer 80. The color filter layer 70 transmits red light R, green light G, and blue light B to corresponding areas of the photoelectric conversion layer 80. The R area 70r of the color filter layer 70 transmits red light to the R area 80r of the photoelectric conversion layer 80. The B area 70b of the color filter layer 70 transmits blue light to the B area 80b of the photoelectric conversion layer 80.

The low refractive index layer 60 includes the first and second beam splitters 42 and 44. The first and second beam splitters 42 and 44 are formed at an upper surface of the low refractive index layer 60 and extend toward the color filter layer 70. However, the first and second beam splitters 42 and 44 do not extend all the way to the color filter layer 70, and thus are separated from the color filter layer 70. The first beam splitter 42 is located above the R area 70r of the color filter layer 70. The second beam splitter 44 is located above the B area 70b of the color filter layer 70. Widths of the first and second beam splitters 42 and 44 in an X-axis direction may be the same. However, heights of the first and second beam splitters 42 and 44 in a Y-axis direction may be different. For example, the height of the first beam splitter 42 may be less than the height of the second beam splitter 44. Specifications (refractive indexes, widths, heights, etc.) of the first and second beam splitters 42 and 44 may vary according to a wavelength of light to be split. For example, the first beam splitter 42 may be a high refractive index layer having certain specifications so that, of the light incident on the beam splitter 42, red light R1 is transmitted without refraction or diffraction, and blue light R2 and R3 is refracted and/or diffracted by the beam splitter 42. This splitting of the incident light is due to a phase difference of light between the inside and the outside of the first beam splitter 42, which is caused by the difference in refractive index between the first beam splitter 42 and the low refractive index layer 60. Such a phase difference may be affected by the specifications of the first beam splitter 42. Therefore, the specifications of the first beam splitter 42 are set (designed) according to desired functions of the first beam splitter 42 so that, of the light incident on the low refractive index layer 60 that corresponds to the R area 70r of the color filter layer 70, the red light R1 is transmitted to the R area 70r of the color filter layer 70. However, of the incident light, the blue light R2 and R3 is split from the red light R1 and is refracted or diffracted by the first beam splitter 42 in a diagonal direction away from the R area 70r of the color filter layer 70. Since the sub-pixels (R, G, and B) of the unit pixel 46 of FIG. 1 form the Bayer pattern, an area corresponding to the blue sub-pixel B, that is, the B area 70b of the color filter layer 70, is diagonally disposed with respect to an area corresponding to the red sub-pixel R, that is, the R area 70r of the color filter layer 70. Therefore, the blue light R2 and R3, which is split by the first beam splitter 42, is incident on an area that is diagonally adjacent and corresponds to the blue sub-pixel B, that is, the B area 70b of the color filter layer 70. As a result, the blue light B1, which is transmitted through the second beam splitter 44 and is directly incident on the B area 70b, and the blue light R2, which is split by the first beam splitter 42, are both incident on the B area 70b of the color filter layer 70. Although not illustrated in FIG. 2, it is obvious from FIG. 1 that the first beam splitter 42 may be provided at a right side of the second beam splitter 44. Blue light, which is incident on the B area 70b of the color filter layer 70 by a first beam splitter that is at the right side of the second beam splitter 44, may be the same as the blue light R3, which is split by the first beam splitter 42 that is at a left side of the second beam splitter 44. Therefore, the blue light incident on the B area 70b of the color filter layer 70 is equal to a sum (B1+R2+R3) of the blue light B1, which is transmitted through the second beam splitter 44 and directly incident on the B area 70b, and the blue light R2 and R3, which is split by the first beam splitters 42 disposed at both sides of the second beam splitter 44.

As in the case of the first beam splitter 42, specifications of the second beam splitter 44 may also be set according to the desired functions thereof. Accordingly, of the incident white light, the blue light B1 is directly transmitted, and the red light B2 and B3 is refracted or diffracted toward the R area 70r of the color filter layer 70 which is nearby. Thus, red light that is incident on the R area 70r of the color filter layer 70 is equal to a sum (R1+B2+B3) of the red light R1, which is transmitted through the first beam splitter 42 and directly incident on the R area 70r, and the red light B2 and B3, which is split by the second beam splitters 44 that are disposed at both sides of the first beam splitter 42. Therefore, an amount of the red light (R1+B2+B3) incident on the R area 70r of the color filter layer 70 corresponding to the red sub-pixel R and an amount of the blue light (B1+R2+R3) incident on the B area 70b of the color filter layer 70 corresponding to the blue sub-pixel B are greater than when the first and second beam splitters 42 and 44 are not provided. Due to the use of the first and second beam splitters 42 and 44, a distribution (or a distribution density) of red light R and blue light B incident on the color filter layer 70 is adjusted. Therefore, less light is absorbed by the color filter layer 70 than when the first and second beam splitters 42 and 44 are not provided.

The low refractive index layer 60 may be formed as a single layer, or alternatively, the low refractive index layer 60 may include first and second low refractive index layers 60a and 60b that are sequentially stacked as shown in FIG. 2. The first and second low refractive index layers 60a and 60b may be transparent to the incident light and may have refractive indexes that are lower than those of the first and second beam splitters 42 and 44. The first and second beam splitters 42 and 44 are included in the second low refractive index layer 60b. The first low refractive index layer 60a may be a silicon oxide layer, for example, a $SiO_2$ layer, but is not limited thereto. The second low refractive index layer 60b may be formed of a material that is the same as or different from a material user to form the first low refractive index layer 60a. If the first and second low refractive index layers 60a and 60b are formed of the same material, the low refractive index layer 60 may be formed as a single layer. A refractive index of the second low refractive index layer 60b may be different from a refractive index of the first low refractive index layer 60a. The second low refractive index layer 60b may be formed of a material having a surface which is more easily planarized than a material used to form the first low refractive index layer 60a. The second low refractive index layer 60b may be, for example, a polymer layer. First and second lens layers 50a and 50b are provided on the low refractive index layer 60. The first and second lens layers 50a and 50b focus incident light L1 toward the first and second beam splitters 42 and 44. The first lens layer 50a covers the first beam splitter 42 and the second lens layer 50b covers the second beam splitter 44. The first and second lens layers 50a and 50b may be micro lenses or etched lenses. The first lens layer 50a is separated from the second lens layer 50b. The first lens layer 50a is located above the R area 70r of the color filter layer 70. The second lens layer 50b is located above the B area 70b of the color filter layer 70.

Figure 3:
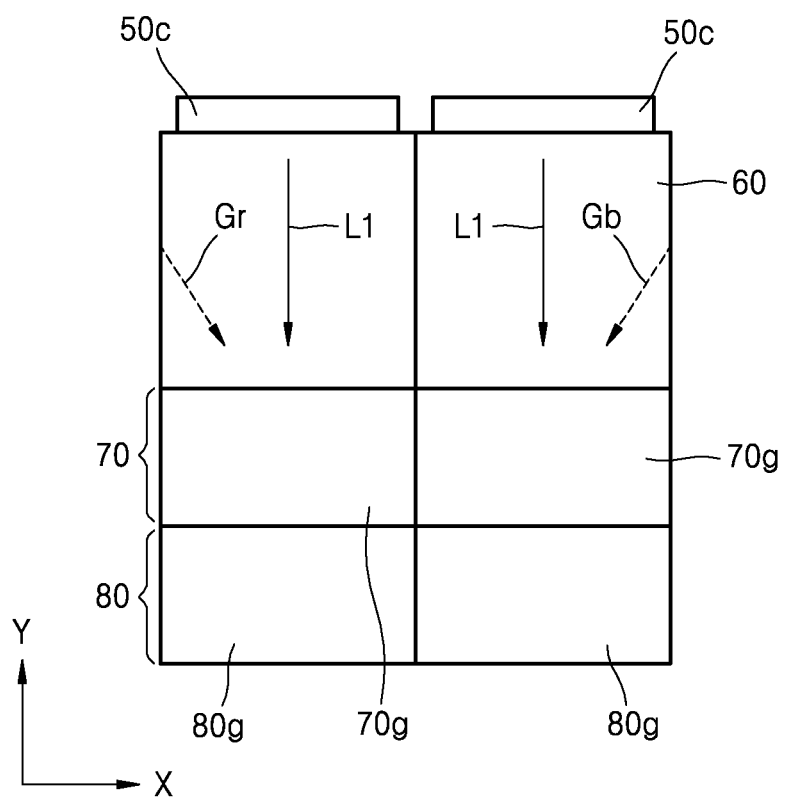
FIG. 3 is a cross-sectional view of FIG. 1 cut along the line 3-3' of FIG. 1.

FIG. 3 is a cross-sectional of FIG. 1 cut along the line 3-3' of FIG. 1. Therefore, a cross-section of an area corresponding to a green sub-pixel G of the first image sensor 40 of FIG. 1 may also be understood with reference to FIG. 3.

Referring to FIG. 3, the photoelectric conversion layer 80, the color filter layer 70, and the low refractive index layer 60 are sequentially stacked, and a third lens layer 50c is provided on the low refractive index layer 60. The first to third lens layers 50a to 50c may be the same. The photoelectric conversion layer 80 includes a G area 80g that performs photoelectrical conversion of incident green light. The color filter layer 70 includes a G area 70g that transmits green light. The low refractive index layer 60 disposed on the G area 70g of the color filter layer 70 does not include a beam splitter. Therefore, white incident light L1 is directly incident on the G area 70g of the color filter layer 70.

Regarding a pixel pattern of the first image sensor 40 and arrangement directions of the first and second beam splitters 42 and 44 shown in FIG. 1, and noting that green light is included in the light split by the first and second beam splitters 42 and 44, not only the incident light L1, but also, green light Gr and Gb may be incident on the G area 70g of the color filter layer 70. The green light Gr and Gb may be incident from areas respectively corresponding to the red sub-pixel R and the blue sub-pixel B which are near to the G area 70g. Therefore, an amount of green light incident on the G area 70g of the color filter layer 70 may also be greater than when the first and second beam splitters 42 and 44 are not provided.

Figure 4:
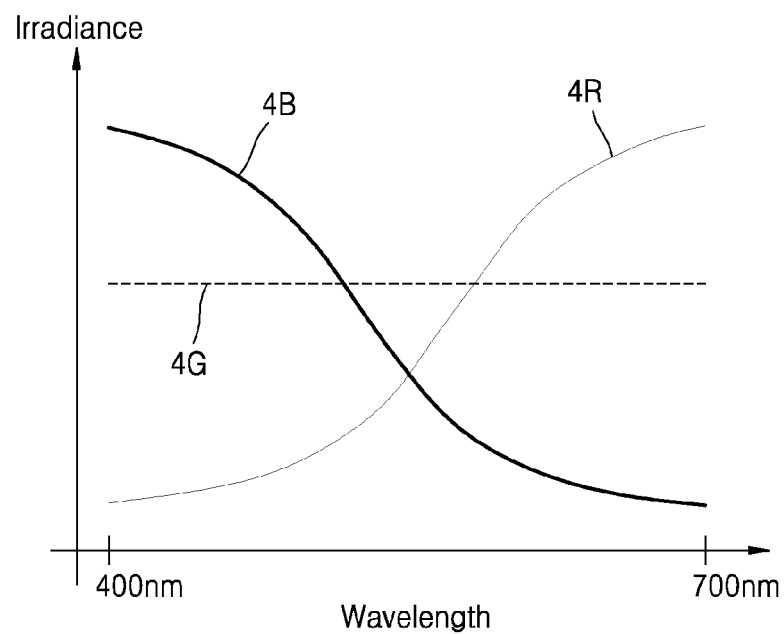
FIG. 4 is a graph of an irradiance distribution of light incident on a color filter layer of the image sensor of FIG. 1.

FIG. 4 is a graph of an irradiance distribution of light incident on the color filter layer 70 of the first image sensor 40 of FIG. 1. The irradiance distribution of FIG. 4 is an irradiance distribution of light before the light is transmitted through the color filter layer 70.

In FIG. 4, a horizontal axis indicates wavelengths of the incident light and a vertical axis indicates irradiance. In FIG. 4, a first graph 4R indicates an irradiance distribution of light incident on an area corresponding to the red sub-pixel R. A second graph 4B indicates an irradiance distribution of light incident on an area corresponding to the blue sub-pixel B. A third graph 4G indicates an irradiance distribution of light incident on an area corresponding to the green sub-pixel G.

Since the area corresponding to the green sub-pixel G does not include a beam splitter, white incident light is directly incident on the green sub-pixel G. Therefore, the third graph 4G shows an even distribution of irradiance regardless of wavelength.

The first graph 4R shows a distribution in which near 700 nm, an irradiance of light incident on an area corresponding to the red sub-pixel R is greater than an irradiance of light incident on an area corresponding to the green sub-pixel G, but toward 400 nm, the irradiance of light incident on the area corresponding to the red sub-pixel R is lower than the incident light toward the area corresponding to the green sub-pixel G. Alternatively, the second graph 4B shows a distribution in which near 400 nm, the irradiance of light incident on the area corresponding to the blue sub-pixel B is greater than the irradiance of light incident on the area corresponding to the green sub-pixel G, but toward 700 nm, the irradiance of light incident on the area corresponding to the blue sub-pixel B is lower than the incident light toward the area corresponding to the green sub-pixel G. This result is obtained because the distribution of red and green light of the incident light is adjusted by the split operations performed by the first and second beam splitters 42 and 44.

Figure 5:
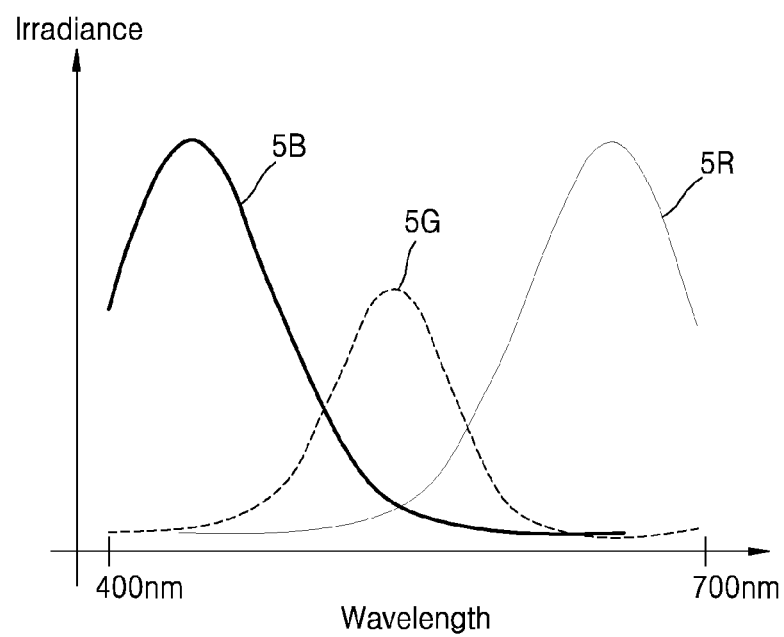
FIG. 5 is a graph of an irradiance distribution of light transmitted through the color filter layer of the image sensor of FIG. 1.

FIG. 5 is a graph of an irradiance distribution of light transmitted through the color filter layer 70 of the first image sensor 40 of FIG. 1.

In FIG. 5, a horizontal axis indicates wavelengths of light and a vertical axis indicates irradiance. In FIG. 5, a first graph 5R indicates an irradiance distribution of light transmitted through the color filter and incident on the area corresponding to the red sub-pixel R, a second graph 5B indicates an irradiance distribution of light transmitted through the color filter and incident on the area corresponding to the blue sub-pixel B. Also, a third graph 5G indicates an irradiance distribution of light transmitted through the color filter and incident on the area corresponding to the green sub-pixel G. Referring to the first to third graphs 5R, 5B, and 5G of FIG. 5, the first graph 5R shows a strong peak near 700 nm, the second graph 5B shows a strong peak near 400 nm, and the third graph 5G shows a strong peak at a range between 400 nm and 700 nm. FIG. 5 implies that an irradiance of red light in the area corresponding to the red sub-pixel R and an irradiance of blue light in the area corresponding to the blue sub-pixel B are greater than when a beam splitter is not included.

Figure 6:
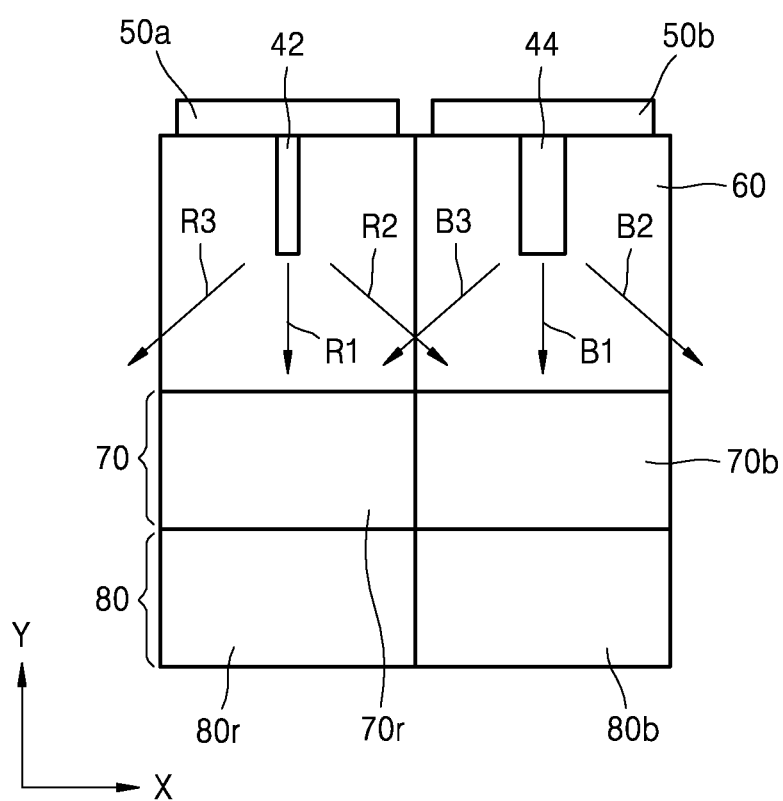
FIG. 6 is a cross-sectional view of a modified example of first and second beam splitters of FIG. 2.

FIG. 6 is a cross-sectional view of a modified example of the first and second beam splitters 42 and 44 of FIG. 2.

Referring to FIG. 6, the first and second beam splitters 42 and 44 have different widths but the same height. A width of the first beam splitter 42 may be less than a width of the second beam splitter 44. In the first and second beam splitters 42 and 44 shown in FIGS. and 6 and various beam splitters described below, a height of a beam splitter may be decrease as a difference between a refractive index of a beam splitter and a refractive index of the low refractive index layer 60 increases.

Figure 7:
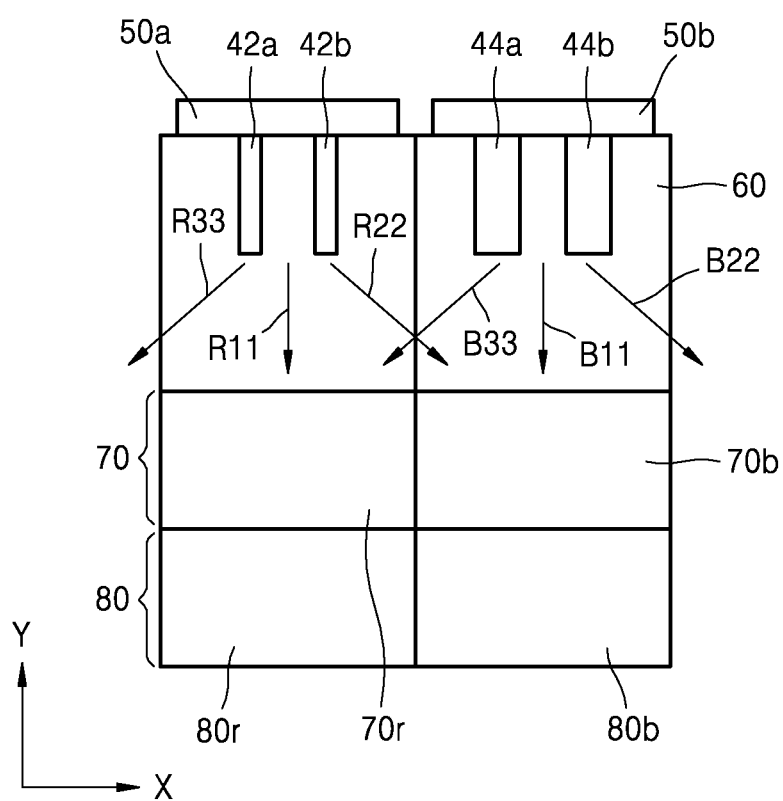
FIG. 7 is a cross-sectional view of an image sensor according to another exemplary embodiment.

FIG. 7 is a cross-sectional view of an image sensor according to another exemplary embodiment (hereinafter, referred to as "second image sensor"). Only those features and elements that are different from the first image sensor 40 will be described. Like reference numerals refer to like elements throughout.

Referring to FIG. 7, third and fourth beam splitters 42a and 42b are disposed in the low refractive index layer 60 that is between the R area 70r of the color filter layer 70 and the first lens layer 50a. The third and fourth beam splitters 42a and 42b are separated from each other and parallel to each other. The third and fourth beam splitters 42a and 42b have the same width and height. The arrangement directions of the third and fourth beam splitters 42a and 42b may be the same as an arrangement direction of the first beam splitter 42, discussed above. One side (e.g. upper ends of the beam splitters, as shown in FIG. 7) of the third and fourth beam splitters 42a and 42b may contact the first lens layer 50a. The third and fourth beam splitters 42a and 42b may be formed of the same material, and may be formed of the same material as the first beam splitter 42. White light having various wavelengths is incident on the third and fourth beam splitters 42a and 42b, and the third and fourth beam splitters 42a and 42b may transmit red light R11 while refracting or diffracting light other than the red light R11. In particular, the third and fourth beam splitters 42a and 42b may diffract or refract blue and green light, and may diffract or refract the blue light to a greater extent than the green light. Therefore, blue light R22 and R33 or blue light and a small amount of green light, which is included in light incident via the first lens layer 50a, may be split by the third and fourth beam splitters 42a and 42b and may thus be diagonally incident on the B area 70b of the color filter layer 70 which is nearby. Therefore, an amount of blue light (B11+R22+R33) that is incident on the B area 70b of the color filter layer 70 may be greater than when the beam splitters 42a and 42b are not provided.

Fifth and sixth beam splitters 44a and 44b are disposed in the low refractive index layer 60 that is between the B area 70b of the color filter layer 70 and the second lens layer 50b. White light having various wavelengths is incident on the fifth and sixth beam splitters 44a and 44b, and the fifth and sixth beam splitters 44a and 44b transmit blue light B11 while diffracting or refracting light other than blue light B11. In particular, the fifth and sixth beam splitters 44a and 44b may diffract or refract red and green light, and the beam splitters 44a and 44b may diffract or refract the red light to a greater extent than the green light. Therefore, red light B22 and B33 or red light and a small amount of green light, which is included in white light incident via the second lens layer 50b, may be split by the fifth and sixth beam splitters 44a and 44b and may be diagonally incident on the R area 70r of the color filter layer 70 which is nearby. Therefore, an amount of red light (R11+B22+B33) that is incident on the R area 70r of the color filter layer 70 may be greater than when the beam splitters 44a and 44b are not provided. The fifth and sixth beam splitters 44a and 44b are separated from each other and parallel to each other. The fifth and sixth beam splitters 44a and 44b are parallel to the third and fourth beam splitters 42a and 42b. The fifth and sixth beam splitters 44a and 44b have the same width and height. Heights of the fifth and sixth beam splitters 44a and 44b may be the same as heights of the third and fourth beam splitters 42a and 42b. However, widths of the fifth and sixth beam splitters 44a and 44b may be greater than widths of the third and fourth beam splitters 42a and 42b. One side of the fifth and sixth beam splitters 44a and 44b (e.g. upper ends of the beam splitters, as shown in FIG. 7) may contact the second lens layer 50b. The fifth and sixth beam splitters 44a and 44b may be formed of the same material, and may be formed of the same material as the second beam splitter 44. If the low refractive index layer 60 includes the first and second low refractive index layers 60a and 60b as shown in FIG. 2, the third to sixth beam splitters 42a, 42b, 44a, and 44b may be disposed in the second low refractive index layer 60b.

Figure 8:
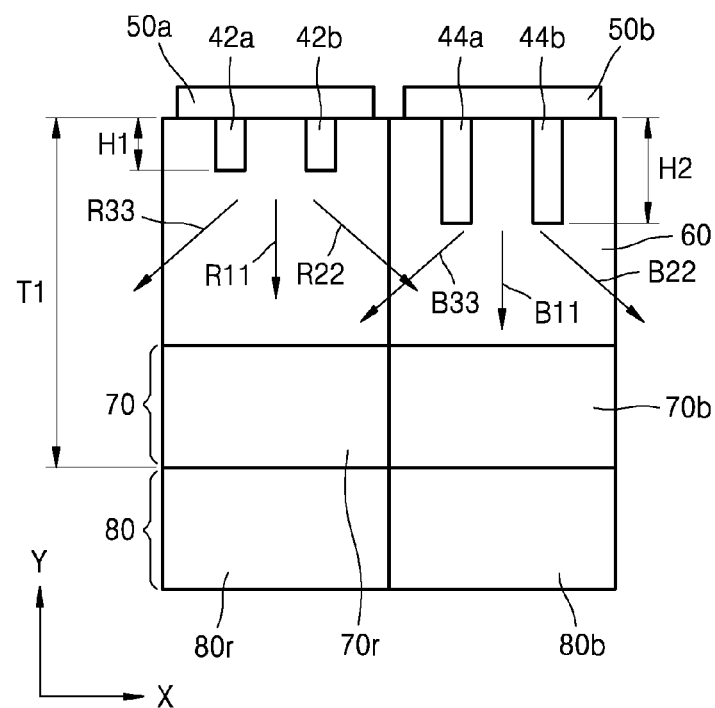
FIG. 8 is a cross-sectional view of a modified example of third to sixth beam splitters of FIG. 7.

FIG. 8 is a cross-sectional view of a modified example of the third to sixth beam splitters 42a, 42b, 44a, and 44b of FIG. 7.

Referring to FIG. 8, the widths of the third and fourth beam splitters 42a and 42b are the same as the widths of the fifth and sixth beam splitters 44a and 44b. However, a height H1 of the third and fourth beam splitters 42a and 42b is less than a height H2 of the fifth and sixth beam splitters 44a and 44b.

As differences between the refractive index of the low refractive index layer 60 and respective refractive indexes of the third to sixth beam splitters 42a, 42b, 44a, and 44b increase, heights of the third to sixth beam splitters 42a, 42b, 44a, and 44b may be decreased. Thus, a thickness of the low refractive index layer 60 may be reduced. Also, since the low refractive index layer 60 includes various beam splitters described above, a distribution (or a distribution density) of red and blue light of the white incident light is adjusted. Accordingly, in the light incident on the color filter layer 70, the irradiance of red light may be high in a light beam incident on the red sub-pixel R and the irradiance of blue light may be high in a light beam incident on the blue sub-pixel B. Therefore, even if a thickness of the color filter layer 70 is less than that of color filter layers in the related art, the color filter layer 70 may still fully perform its functions. In consideration of the description above, a thickness T1 from an upper surface of the low refractive index layer 60 to a bottom surface of the color filter layer 70 may be adjusted according to a degree to which incident light is split and a difference between a refractive index of a beam splitter and the refractive index of the low refractive index layer 60.

Hereinafter, an image sensor according to another exemplary embodiment of the present invention (hereinafter, referred to as "third image sensor") will be described.

Figure 9:
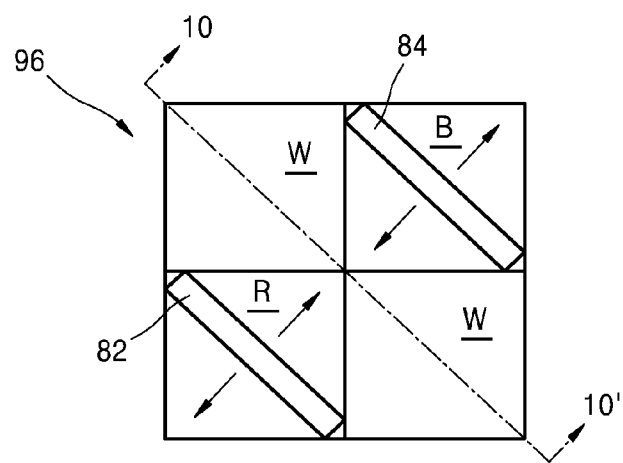
FIG. 9 is a plan view of a unit pixel of an image sensor according to another exemplary embodiment.
Figure 10:
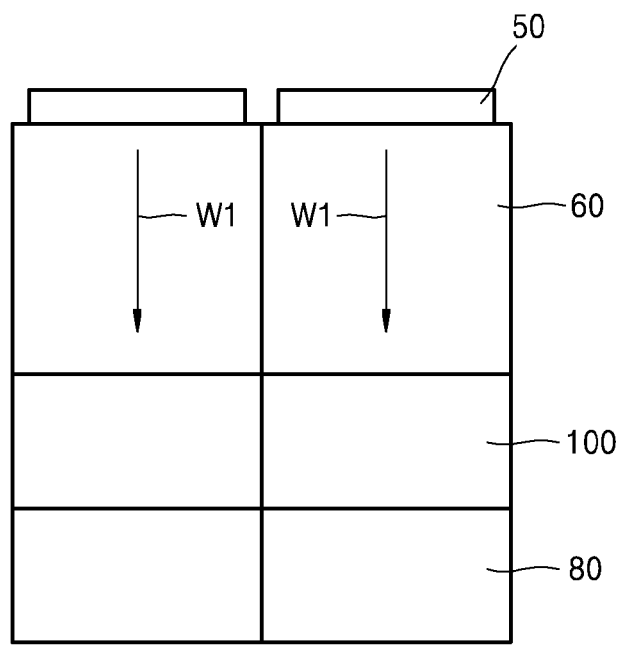
FIG. 10 is a cross-sectional view of FIG. 9 cut along the line 10-10' of FIG. 9.

FIG. 9 is a plan view of a unit pixel 96 of the third image sensor. FIG. 10 is a cross-sectional view of FIG. 9 cut along the line 10-10' of FIG. 9.

Referring to FIG. 9, the unit pixel 96 may have a Bayer pattern in which one red sub-pixel R, one blue sub-pixel B, and two white sub-pixels W. An area corresponding to the red sub-pixel R and an area corresponding to the blue sub-pixel B respectively include beam splitters 82 and 84. Areas corresponding to the white sub-pixels W do not include a beam splitter. Therefore, white light is directly incident on the white sub-pixels W without being filtered. By performing an additional process after the light is sensed, a green light G signal may be extracted.

Referring to FIG. 10, a transparent layer 100 is provided between the photoelectric conversion layer 80 and the low refractive index layer 60. Unlike the color filter layer 70, the transparent layer 100 does not absorb light and is transparent to white light W1, which includes all visible light from red to blue. Therefore, the transparent layer 100 may be omitted. The white light W1 is transmitted through the transparent layer 100 and is incident on the photoelectric conversion layer 80.

Figure 11:
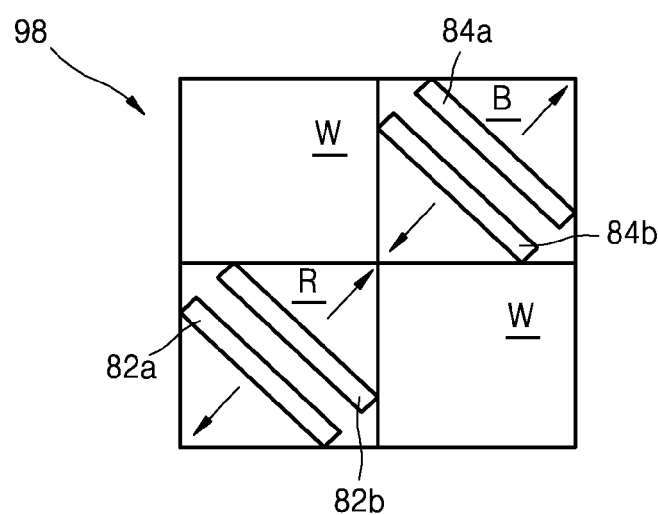
FIG. 11 is a plan view of an example in which two beam splitters are provided in each of a red sub-pixel and a blue sub-pixel of FIG. 9.

FIG. 11 is a plan view of an example in which two beam splitters are provided in each of a red sub-pixel R and a blue sub-pixel B of FIG. 9.

Referring to FIG. 11, a unit pixel 98 includes first and second beam splitters 82a and 82b in the red sub-pixel R which are parallel to each other and arranged in a diagonal direction of the red sub-pixel R, and third and fourth beam splitters 84a and 84b in the blue sub-pixel B which are parallel to each other and arranged in a diagonal direction of the blue sub-pixel B.

Figure 12:
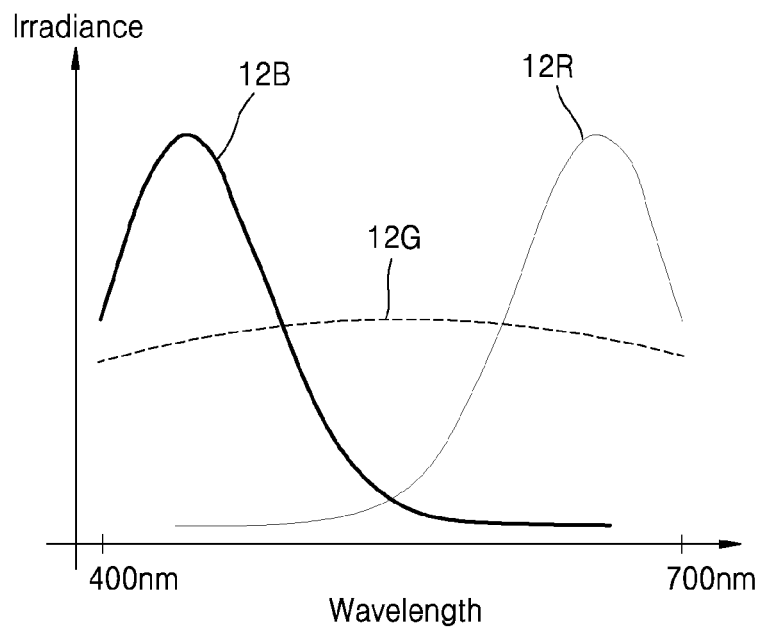
FIG. 12 is a graph of an irradiance distribution of light received in an image sensor of FIGS. 9 and 10.

FIG. 12 is a graph of an irradiance distribution of light received by the image sensor of FIGS. 9 and 10.

In FIG. 12, a horizontal axis indicates wavelengths of incident light and a vertical axis indicates irradiance.

In FIG. 12, a first graph 12R indicates an irradiance distribution of light incident on an area corresponding to the red sub-pixel R. A second graph 12B indicates an irradiance distribution of light incident on an area corresponding to the blue sub-pixel B. A third graph 12W indicates an irradiance distribution of light incident on areas corresponding to the white sub-pixels W.

With regard to the first to third graphs 12R, 12B, and 12W of FIG. 12, the first graph 12R has a peak near 700 nm. The second graph 12B has a peak near 400 nm. The third graph 12W does not have a peak, but shows an irradiance distribution that corresponds to a median of irradiances of light incident on the area corresponding to the red sub-pixel R or the blue sub-pixel B over the entire range of 400 nm to 700 nm.

Figure 13:
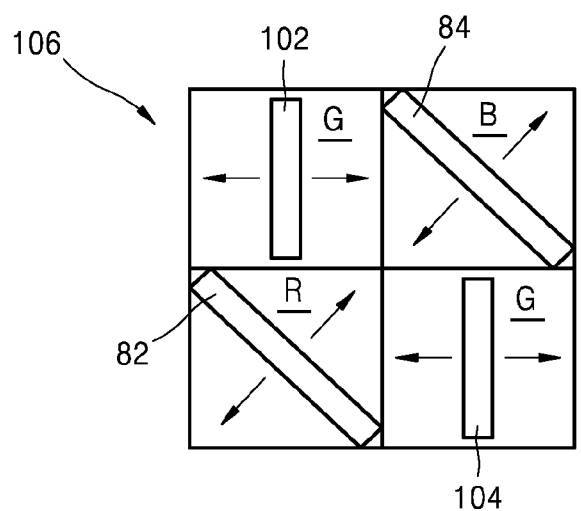
FIG. 13 is a plan view of a unit pixel of an image sensor according to another exemplary embodiment.

FIG. 13 is a plan view of a unit pixel 106 of an image sensor according to another exemplary embodiment (hereinafter, referred to as "fourth image sensor").

Referring to FIG. 13, the unit pixel 106 includes one beam splitter 82 in a red sub-pixel R, one beam splitter 84 in a blue sub-pixel B, and beam splitters 102 and 104 respectively in the two green sub-pixels G. Unlike the beam splitters 82 and 84 respectively included in the red and blue sub-pixels R and B that are nearby, the beam splitters 102 and 104 in the green sub-pixels G are not disposed in a diagonal direction of the green sub-pixels G. The beam splitters 102 and 104 in the green sub-pixels G are not parallel to the beam splitters 82 and 84 respectively included in the red and blue sub-pixels R and B that are nearby, and form predetermined angles therewith. The beam splitters 102 and 104 in the green sub-pixels G are parallel to first sides of the green sub-pixels G and perpendicular to second sides of the green sub-pixels G. The first and second sides are perpendicular to each other. By including the beam splitters 102 and 104 in the green sub-pixels G, a red light component and a blue light component of light incident on the green sub-pixels G may be split and thus be incident on the blue sub-pixel B or the red sub-pixel R that is nearby the green sub-pixels G. Therefore, since an amount of blue light incident on the blue sub-pixel B and an amount of red light incident on the red sub-pixel R are greater than when the beam splitters 102 and 104 are not included in the green sub-pixels G, colors may be more vivid.

Figure 14:
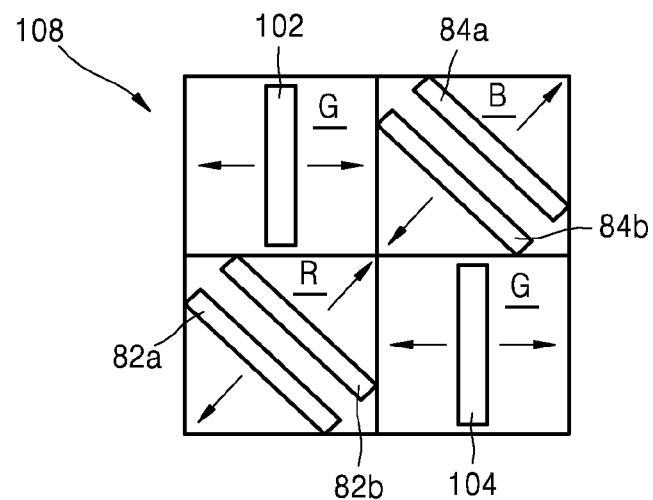
FIG. 14 is a plan view of an example in which two beam splitters are provided in each of a red sub-pixel and a blue sub-pixel of FIG. 13.

FIG. 14 is a plan view of an example in which two beam splitters are provided in each of the red and blue sub-pixels R and B of FIG. 13.

In FIG. 14, a case in which the red sub-pixel R and the blue sub-pixel B respectively include two beam splitters 82a and 82b and two beam splitters 84a and 84b may be the same as the embodiment of FIG. 11.

Figure 15:
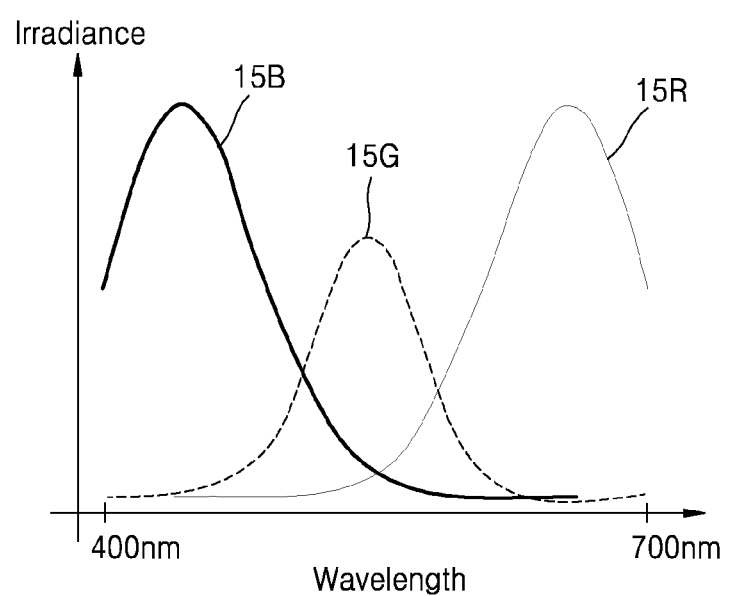
FIG. 15 is a graph of an irradiance distribution of light received in an image sensor having the unit pixel of FIG. 13 or 14.

FIG. 15 is a graph of an irradiance distribution of light received by an image sensor having the unit pixel of FIG. 13 or 14;

In FIG. 15, a horizontal axis indicates wavelengths of incident light and a vertical axis indicates irradiance.

In FIG. 15, a first graph 15R indicates an irradiance distribution of light incident on an area corresponding to the red sub-pixel R. A second graph 15B indicates an irradiance distribution of light incident on an area corresponding to the blue sub-pixel B. A third graph 15G indicates an irradiance distribution of light incident on an area corresponding to the green sub-pixel G.

With regard to the first to third graphs 15R, 15B, and 15G of FIG. 15, the first graph 15R has a peak near 700 nm and the second graph 15B has a peak near 400 nm. These results imply that an amount of red light incident on the area corresponding to the red sub-pixel R has increased and an amount of blue light incident on the area corresponding to the blue sub-pixel B has increased. Also, the third graph 15G has a peak in a wavelength range between 400 nm and 700 nm, which is lower than the peaks in the first and second graphs 15R and 15B. This result implies that an amount of green light incident on the area corresponding to the green sub-pixel G has also increased.

Figure 16:
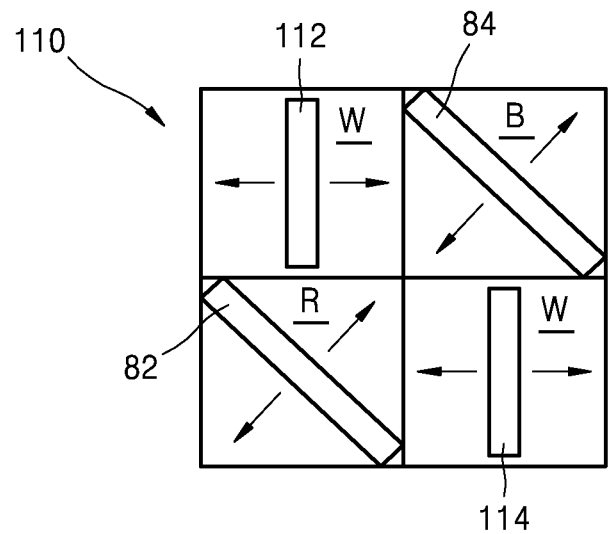
FIG. 16 is a plan view of a unit pixel of an image sensor according to another exemplary embodiment.

FIG. 16 is a plan view of a unit pixel 110 of an image sensor according to another exemplary embodiment of the present disclosure (hereinafter, referred to as "fifth image sensor").

Referring to FIG. 16, the unit pixel 110 includes one red sub-pixel R, one blue sub-pixel B, and two white sub-pixels W. One beam splitter 82 and one beam splitter 84 are respectively included in the red and blue sub-pixels R and B. One beam splitter 112 and one beam splitter 114 are included in the two white sub-pixels W. An arrangement of the beam splitters 82, 84, 112, and 114 in the unit pixel 110 shown in FIG. 16 may be the same as that shown in FIG. 13.

Figure 17:
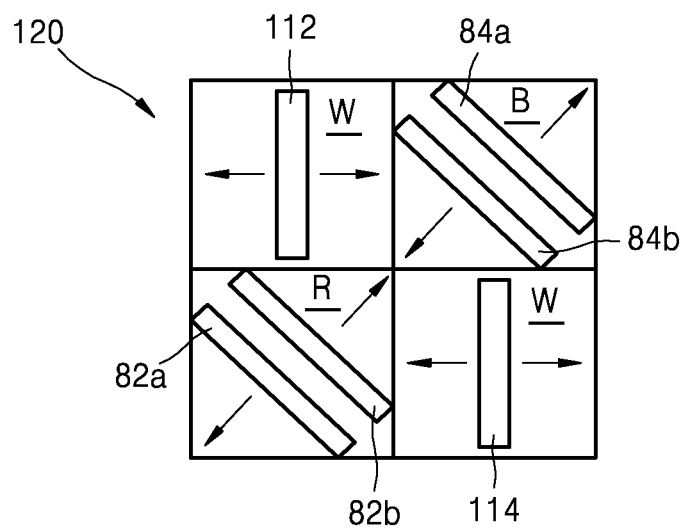
FIG. 17 is a plan view of an example in which two beam splitters are provided in each of a red sub-pixel and a blue sub-pixel of FIG. 16.

FIG. 17 is a plan view of an example in which two beam splitters are provided in each of the red and blue sub-pixels R and B of FIG. 16.

Referring to FIG. 17, a unit pixel 120 includes one beam splitter 112 and one beam splitter 114 in the areas corresponding to the two white sub-pixels W, and two beam splitters 82a and 82b and two beam splitters 84a and 84b respectively in the areas corresponding to the red and blue sub-pixels R and B. An arrangement of the beam splitters 82a, 82b, 84a, 84b, 112, and 114 in the unit pixel 120 shown in FIG. 17 may be the same as that shown in FIG. 14.

Figure 18:
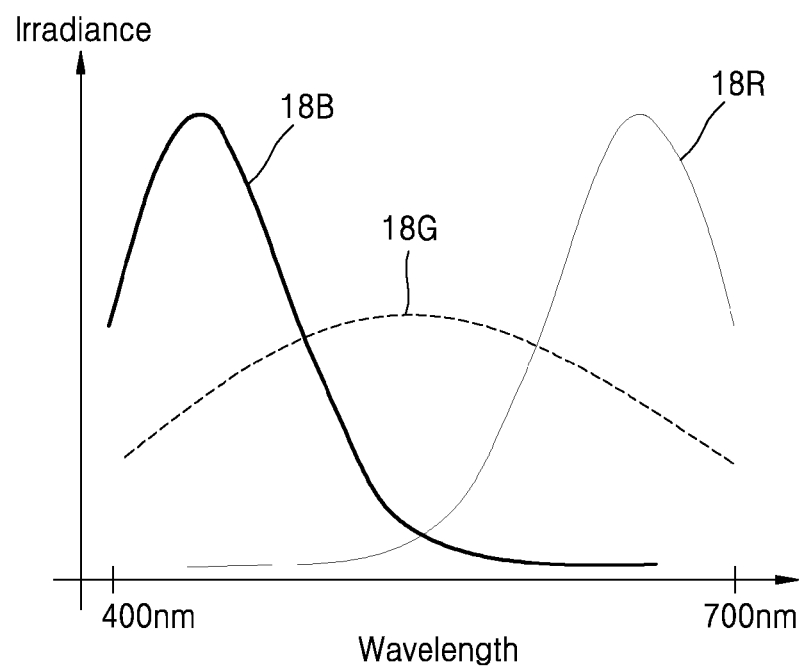
FIG. 18 is a graph of an irradiance distribution of light received in an image sensor having the unit pixel of FIG. 16 or 17.

FIG. 18 is a graph of an irradiance distribution of light received by an image sensor having the unit pixel 110 or 120 of FIG. 16 or 17.

In FIG. 18, a horizontal axis indicates wavelengths of the incident light and a vertical axis indicates irradiance.

In FIG. 18, a first graph 18R indicates an irradiance distribution of light incident on an area corresponding to the red sub-pixel R. A second graph 18B indicates an irradiance distribution of light incident on an area corresponding to the blue sub-pixel B. A third graph 18G indicates an irradiance distribution of light incident on areas corresponding to the green sub-pixels G.

With regard to the first to third graphs 18R, 18B, and 18G of FIG. 18, the first graph 18R has a peak near 700 nm and the second graph 18B has a peak near 400 nm. These results imply that an amount of red light incident on the area corresponding to the red sub-pixel R has increased and an amount of blue light incident on the area corresponding to the blue sub-pixel B has increased. The third graph 18G does not have a peak that is as sharp as the peaks of the first and second graphs 18R and 18B. However, an amount of green light incident on the areas corresponding to the white sub-pixels W is increased due to the influence of the beam splitter 82a, 82b, 84a, and 84b disposed in the red and blue sub-pixels R and B, and thus, the irradiance in a range between 400 nm and 700 nm is increased.

Figure 19:
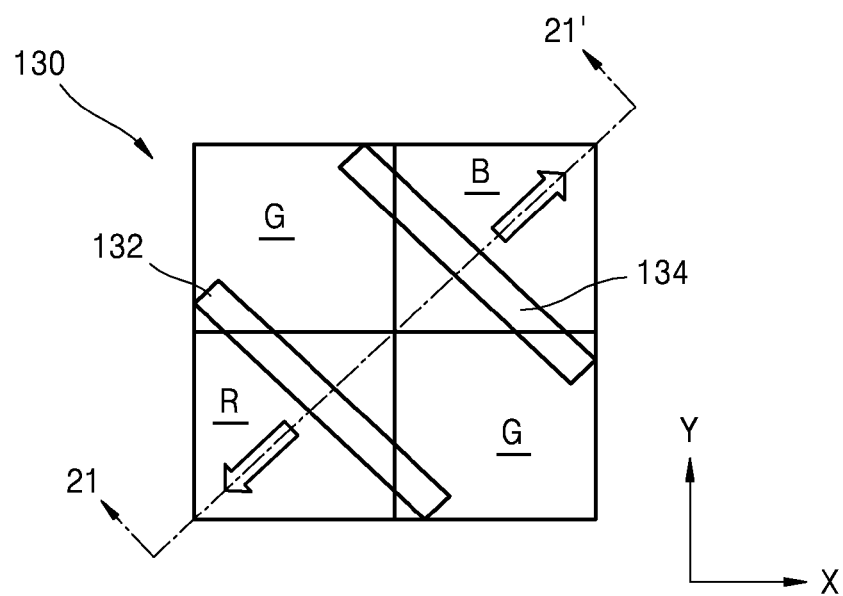
FIG. 19 is a plan view of a unit pixel of an image sensor according to another exemplary embodiment.

FIG. 19 is a plan view of a unit pixel 130 of an image sensor according to another exemplary embodiment (hereinafter, referred to as "sixth image sensor").

Referring to FIG. 19, the unit pixel 130 has a Bayer pattern including one red sub-pixel R, one blue sub-pixel B, and two green sub-pixels G. The unit pixel 130 includes first and second beam splitters 132 and 134 that extend, respectively, through the red R and blue B sub-pixels and into the green sub-pixels G (hereinafter, referred to as "first and second extending beam splitters 132 and 134"). The first and second extending beam splitters 132 and 134 are separated from each other and are arranged in a diagonal direction, that is, arranged at 45° with respect to the X-axis (and with respect to the boundaries between sub-pixels). The first extending beam splitter 132 is parallel to a first diagonal line (a diagonal line inclined by an angle of 135° with respect to the X-axis) of the red sub-pixel R and separated from the first diagonal line. The first extending beam splitter 132 is disposed between first diagonal line of the red sub-pixel R and a corner at which the red and blue sub-pixels R and B meet. An end of the first extending beam splitter 132 extends into one of the two green sub-pixels G and the other end of the first extending beam splitter 132 extends into the other one of the two green sub-pixels G. The second extending beam splitter 134 is parallel to a first diagonal line (a diagonal line inclined by an angle of 135° with respect to the X-axis) of the blue sub-pixel B and extends into the two green sub-pixels G in the same way as the first extending beam splitter 132. Due to the above-described arrangement of the first and second extending beam splitters 132 and 134, unlike the beam splitters described above, the first and second extending beam splitters 132 and 134 may asymmetrically split colors.

Figure 20:
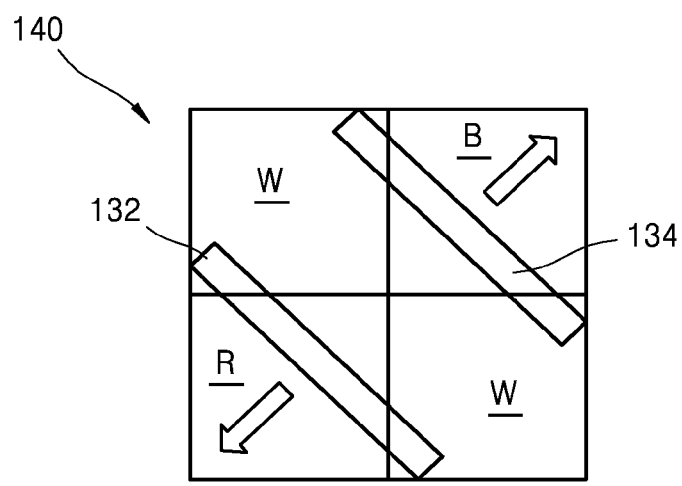
FIG. 20 is a plan view of an example in which a white sub-pixel is provided at a position of a green sub-pixel of FIG. 19.

FIG. 20 is a plan view of a unit pixel 140 having a similar structure as the unit pixel 130 of FIG. 19.

The unit pixel 140 of FIG. 20 is different from the unit pixel 130 of FIG. 19 in that two white sub-pixels W are disposed at locations of the two green sub-pixels G. Other features and elements of the unit pixel 140 of FIG. 20 may be the same as those of the unit pixel 130 of FIG. 19.

Figure 21:
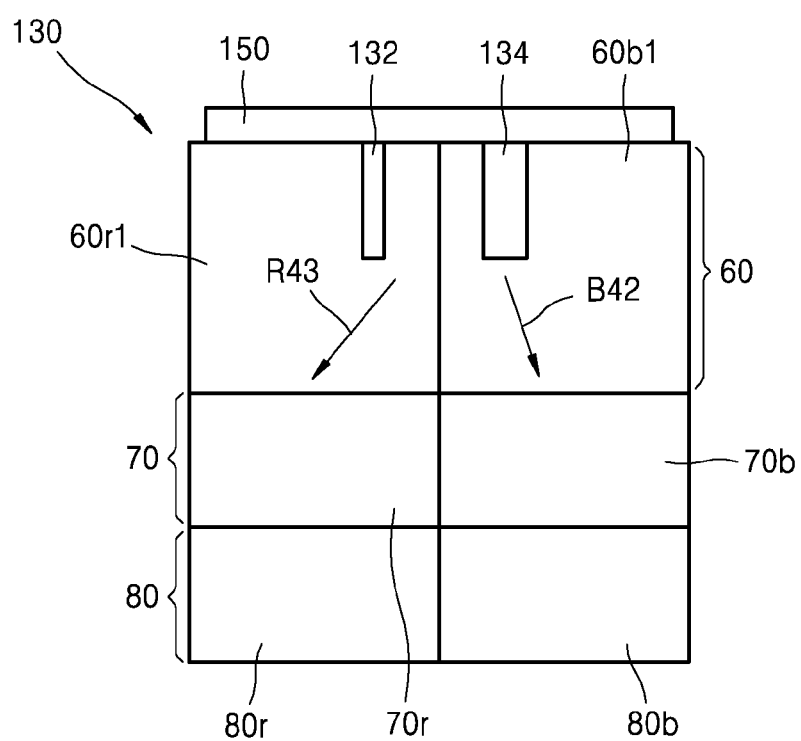
FIG. 21 is a cross-sectional view of FIG. 19 cut along the line 21-21' of FIG. 19.

FIG. 21 is a cross-sectional view of FIG. 19 cut along the line 21-21' of FIG. 19.

Referring to FIG. 21, the unit pixel 130 includes the photoelectric conversion layer 80, the color filter layer 70, and the low refractive index layer 60 that are sequentially stacked. The first and second extending beam splitters 132 and 134 are provided in the low refractive index layer 60. The first extending beam splitter 132 is provided in an R area 60r1 of the low refractive index layer 60 which corresponds to an R area 70r of the color filter layer 70. The second extending beam splitter 134 is provided in a B area 60b1 of the low refractive index layer 60 which corresponds to a B area 70b of the color filter layer 70. The first and second extending beam splitters 132 and 134 are separated from the color filter layer 70. The first and second extending beam splitters 132 and 134 are disposed, respectively, between a boundary of the R area 60r1 and the B area 60b1 and centerlines of the R area 60r1 and the B area 60b1 of the low refractive index layer 60. The first and second extending beam splitters 132 and 134 have the same heights. However, a width of the first extending beam splitter 132 is less than a width of the second extending beam splitter 134. Although not illustrated, as in some embodiments of the above-described beam splitters, the first and second extending beam splitters 132 and 134 may have different heights but the same width. For example, a height of the first extending beam splitter 132 may be less than a height of the second extending beam splitter 134, and respective widths of the first and second extending beam splitters 132 and 134 may be the same. The first and second extending beam splitters 132 and 134 may be formed of the same material, and may be formed of a material that is the same as a material used to form the above-described beam splitters. The low refractive index layer 60 may include the first and second low refractive index layers 60a and 60b that are sequentially stacked as shown in FIG. 2. In this case, the first and second extending beam splitters 132 and 134 may be included in the second low refractive index layer 60b. A lens layer 150 is provided on the low refractive index layer 60. The lens layer 150 covers the R area 60r1 and the B area 60b1 of the low refractive index layer 60 and the first and second extending beam splitters 132 and 134. The lens layer 150 may contact the first and second extending beam splitters 132 and 134. The lens layer 150 may be formed of a material that is the same as a material used to form the above-described lens layers.

In FIG. 21, reference numeral "B42" indicates blue light included in light incident on the B area 60b1 of the low refractive index layer 60 in which the second extending beam splitter 134 is provided. Also, reference numeral "B43" indicates red light that is split from the incident light by the second extending beam splitter 134 and incident on the R area 70r of the color filter layer 70.

Hereinafter, results of first to third simulations performed to compare an irradiance distribution of the above-described image sensors according to exemplary embodiments and an irradiance distribution of an image sensor of the related art that does not include a beam splitter (for example, a backside illumination (BSI) sensor) will be described.

<First Simulation>

In an image sensor of the related art used in the first simulation, an organic color filter layer has a thickness of 0.8 µm (800 nm) and an entire thickness of the organic color filter layer and a lens layer is 1.79 µm. Also, the lens layer is a micro lens having a radius of curvature of 0.7 µm and is coated with an anti-reflection film. An image sensor according to an exemplary embodiment is the image sensor of FIG. 8 that includes coupled beam splitters. In this case, the color filter layer 70 of the image sensor according to FIG. 8 is the same as the organic color filter layer of the image sensor of the related art, and an entire thickness T1 of the color filter layer 70 and the low refractive index layer 60 of the image sensor according to FIG. 8 is set as 2.3 µm. Also, the low refractive index layer 60 is a $SiO_2$ layer and the third to sixth beam splitters 42a, 42b, 44a, and 44b are formed of $TiO_2$. The height H1 of the third and fourth beam splitters 42a and 42b is 250 nm and the height H2 of the fifth and sixth beam splitters 44a and 44b is 550 nm. In the present simulation, photoelectric conversion layers of the image sensor of the related art and the image sensor according to FIG. 8 are silicon layers.

Figure 22:
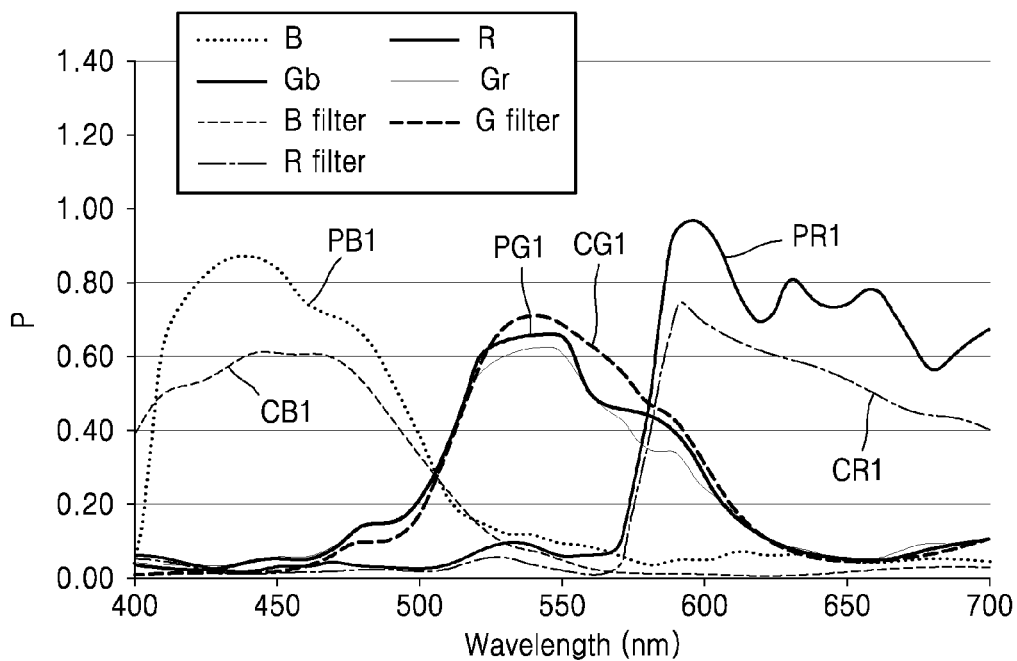
FIGS. 22 to 24 are graphs of results of first to third simulations performed to compare a irradiance distribution of an image sensor according to exemplary embodiments and a irradiance distribution of an image sensor of the related art that does not include a beam splitter.

FIG. 22 shows a result of the first simulation.

In FIG. 22, a horizontal axis indicates wavelengths of the incident light and a vertical axis indicates irradiance.

In FIG. 22, a first graph PR1 indicates an irradiance distribution in a red sub-pixel of the image sensor according to principles of the present disclosure. Also, second and third graphs PB1 and PG1 indicate irradiance distributions in blue and green sub-pixels, respectively. A fourth graph CR1 indicates an irradiance distribution in a red sub-pixel of the image sensor of the related art and fifth and sixth graphs CB1 and CG1 indicate irradiance distributions in blue and green sub-pixels, respectively.

As shown by the first and fourth graphs PR1 and CR1 of FIG. 22, an irradiance of red light in the red sub-pixel is greater in the image sensor according to principles of the present disclosure than in the image sensor of the related art. Also, as shown by the second and fifth graphs PB1 and CB1, an irradiance of blue light in the blue sub-pixel is also greater in the image sensor according to principles of the present disclosure than the image sensor of the related art. As shown by the third and sixth graphs PG1 and CG1, an irradiance of green light in the green sub-pixel of the image sensor according to principles of the present disclosure is not greatly different from that of the image sensor of the related art.

<Second Simulation>

The thickness of the color filter layer 70 of the image sensor according to principles of the present disclosure is set as 600 nm, which is less than the thickness thereof in the first simulation. Other conditions are the same as those of the first simulation.

Figure 23:
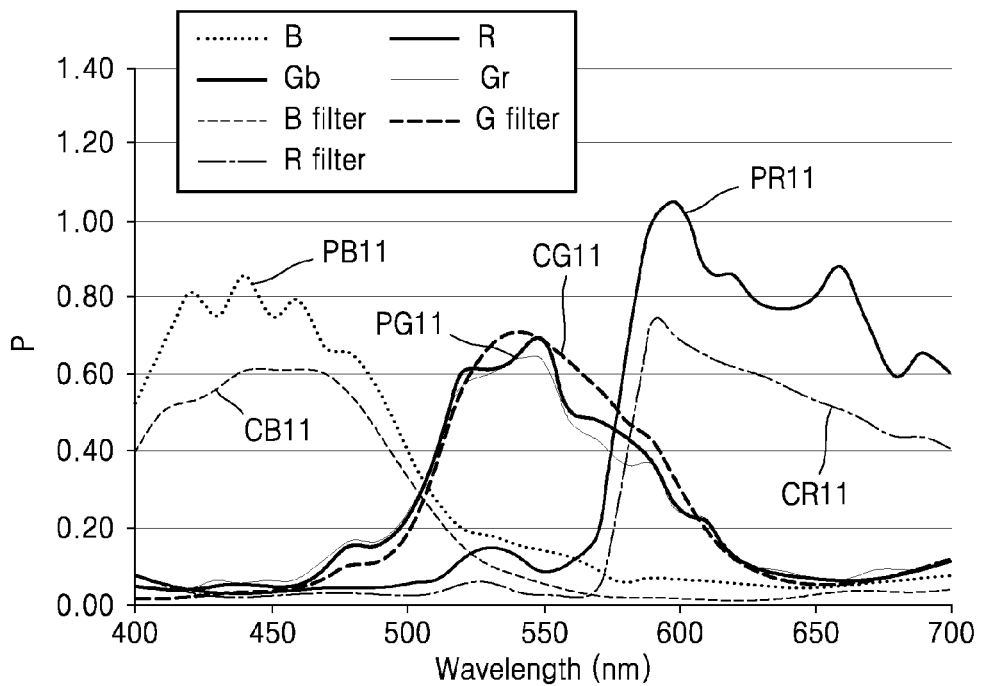

FIG. 23 shows a result of the second simulation.

A horizontal axis and a vertical axis of FIG. 23 is the same as those in FIG. 22. In FIG. 23, a first graph PR11 indicates an irradiance distribution in the red sub-pixel of the image sensor according to principles of the present disclosure and second and third graphs PB11 and PG11 indicate irradiance distributions in the blue and green sub-pixels, respectively. A fourth graph CR11 indicates an irradiance distribution in a red sub-pixel of the image sensor of the related art and fifth and sixth graphs CB11 and CG11 indicate irradiance distributions in blue and green sub-pixels, respectively.

As shown by the first and fourth graphs PR11 and CR11 of FIG. 23, an irradiance of red light in the red sub-pixel is greater in the image sensor according to principles of the present disclosure than in the image sensor of the related art. Also, as shown by the second and fifth graphs PB11 and CB11, an irradiance of blue light in the blue sub-pixel is also greater in the image sensor according to principles of the present disclosure than the image sensor of the related art. Also, as shown by the third and sixth graphs PG11 and CG11, an irradiance of green light in the green sub-pixel of the image sensor according to principles of the present disclosure is not greatly different from that of the image sensor of the related art. The result shown in FIG. 23 implies that since beam splitters are included, an image sensor according to principles of the present disclosure may obtain a spectrum with high color purity even when a color filter layer is thinner than that of the related art.

<Third Simulation>

In the third simulation, a color filter layer is removed from an area corresponding to a green sub-pixel of the image sensor according to principles of the present disclosure. Other conditions are the same as those of the first simulation.

Figure 24:
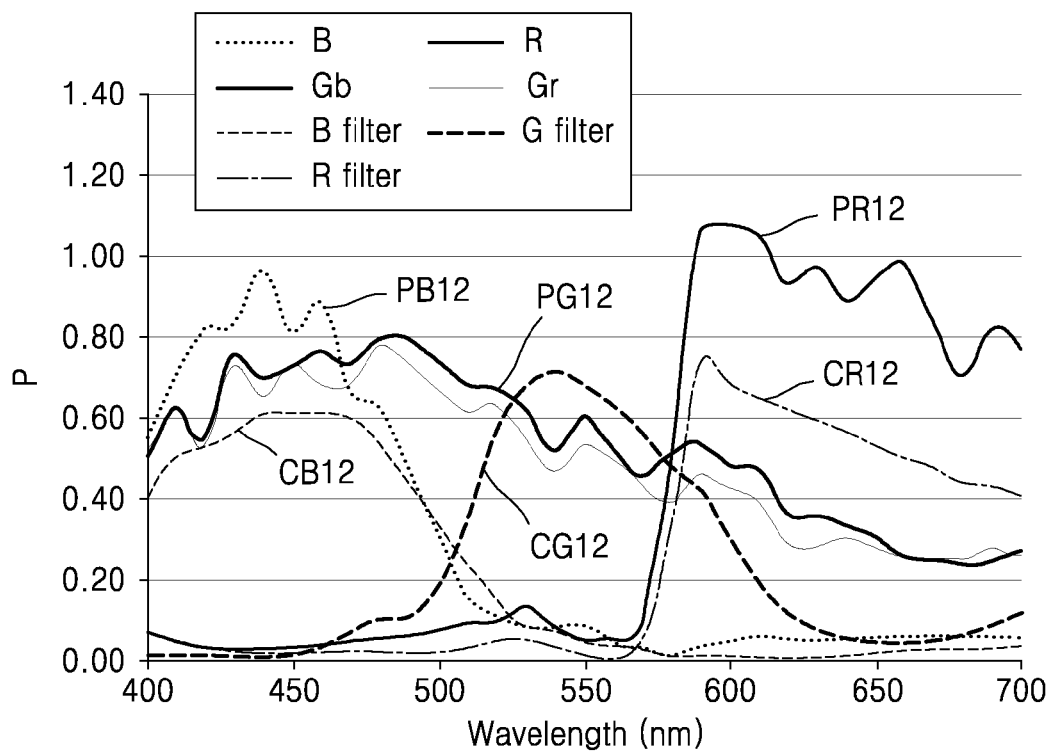

FIG. 24 shows a result of the third simulation. A horizontal axis and a vertical axis of FIG. 24 are the same as those in FIG. 22. In FIG. 24, a first graph PR12 indicates an irradiance distribution in the red sub-pixel of the image sensor according to principles of the present disclosure and second and third graphs PB12 and PG12 indicate irradiance distributions in the blue and green sub-pixels, respectively. A fourth graph CR12 indicates an irradiance distribution in a red sub-pixel of the image sensor of the related art and fifth and sixth graphs CB12 and CG12 indicate irradiance distributions in blue and green sub-pixels, respectively.

As shown by the first and fourth graphs PR12 and CR12 of FIG. 24, an irradiance of red light in the red sub-pixel is greater in the image sensor according to principles of the present disclosure than in the image sensor of the related art. Also, as shown by the second and fifth graphs PB12 and CB12, an irradiance of blue light in the blue sub-pixel is also greater in the image sensor according to principles of the present disclosure than the image sensor of the related art. Also, as shown by the third and sixth graphs PG12 and CG12, since the color filter layer is not provided in an area corresponding to the green sub-pixel of the image sensor according to principles of the present disclosure, the third graph PG12 does not show an irradiance peak that is shown in the sixth graph CG12 of the image sensor of the related art, and an irradiance distribution is shown across all wavelength bands. In this case, the green color may be restored during image processing operations.

According to the first to third simulations, at least an irradiance of red light in the red sub-pixel and an irradiance of blue light in the blue sub-pixel of the image sensors according to principles of the present disclosure are greater than those of the image sensor of the related art, and the same result is obtained even when the thickness of the color filter layer is less than that of the image sensor of the related art. This result implies that the image sensor according to principles of the present disclosure has a higher light efficiency and a better ability of producing vivid colors than the image sensor of the related art.

Hereinafter, a method of manufacturing the image sensor according to an exemplary embodiment will be described with reference to FIGS. 25 to 34.

Figure 25:
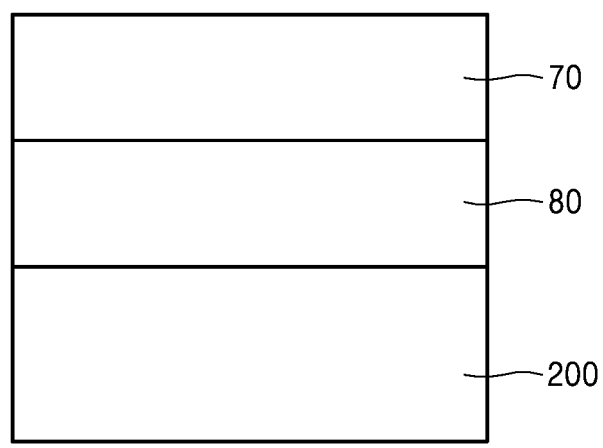
FIGS. 25 to 35 are cross-sectional views of operations of a method of manufacturing an image sensor, according to an exemplary embodiment.

Referring to FIG. 25, the photoelectric conversion layer 80 is formed on a substrate 200. The substrate 200 may include a circuit unit that processes current, that is, image sensing signals, generated by the photoelectric conversion layer 80. The photoelectric conversion layer 80 converts incident light that includes image information into current signals. The photoelectric conversion layer 80 may be a silicon-based layer. The color filter layer 70 is formed on the photoelectric conversion layer 80. The color filter layer 70 may be an organic dye layer. The photoelectric conversion layer 80 and the color filter layer 70, together, may be referred to as a lower layer including a color filter. The substrate 200 may be included in the lower layer.

Figure 26:
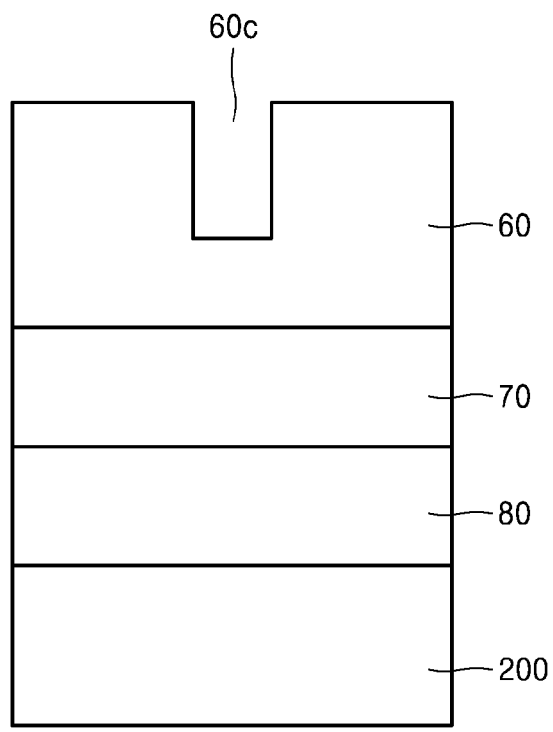
Figure 26:
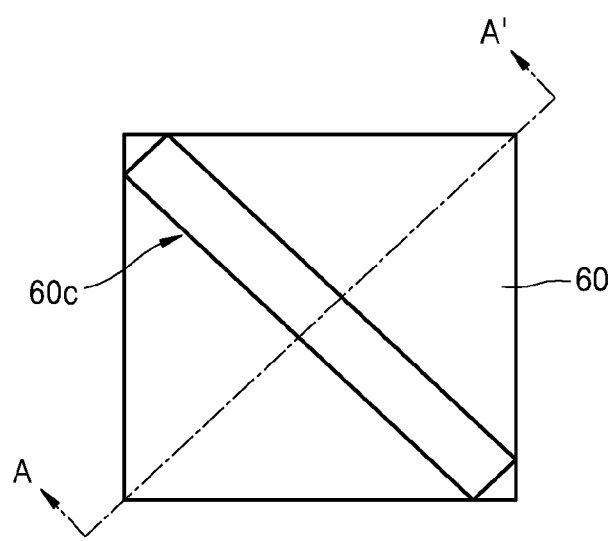
Figure 29:
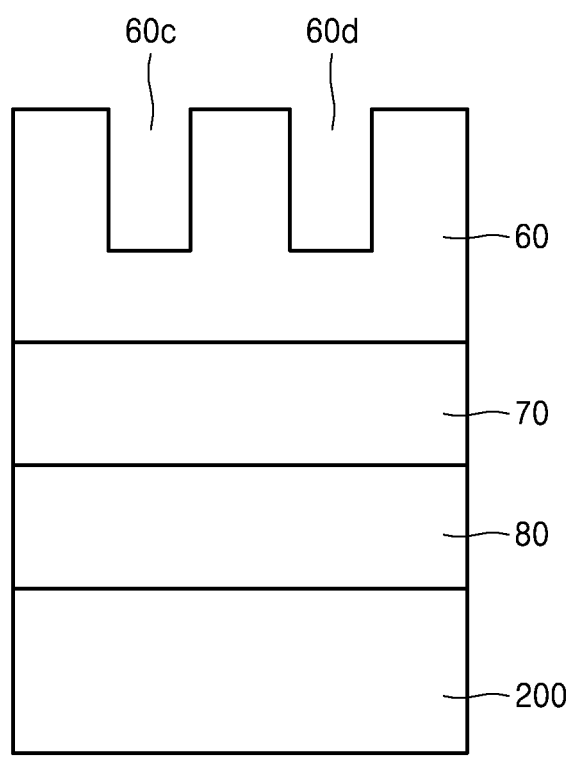

As shown in part (a) of FIG. 26, the low refractive index layer 60 is formed on the color filter layer 70. An upper surface of the low refractive index layer 60 is planarized. The low refractive index layer 60 may be formed of a material that is transparent to the incident light. The low refractive index layer 60 may be a $SiO_2$ layer, but is not limited thereto. A first trench (or groove) 60c is formed in a predetermined area of the low refractive index layer 60. The predetermined area of the low refractive index layer 60 may be an area corresponding to the red sub-pixel R or to the blue sub-pixel B. The first trench 60c may be formed in a diagonal direction of the low refractive index layer 60, as shown in part (b) of FIG. 26. Part (a) of FIG. 26 is a cross-sectional view of part (b) of FIG. 26 cut along the line A-A'. Part (b) of FIG. 26 is a plan view of part (a) of FIG. 26. Other than the first trench 60c, a second trench 60d may be formed in the predetermined area of the low refractive index layer 60 as shown in FIG. 29. The second trench 60d may be separated from the first trench 60c and parallel to the first trench 60c. Specifications (for example, heights, depths, and widths) of the first trench 60c and the second trench 60d may be the same.

Figure 27:
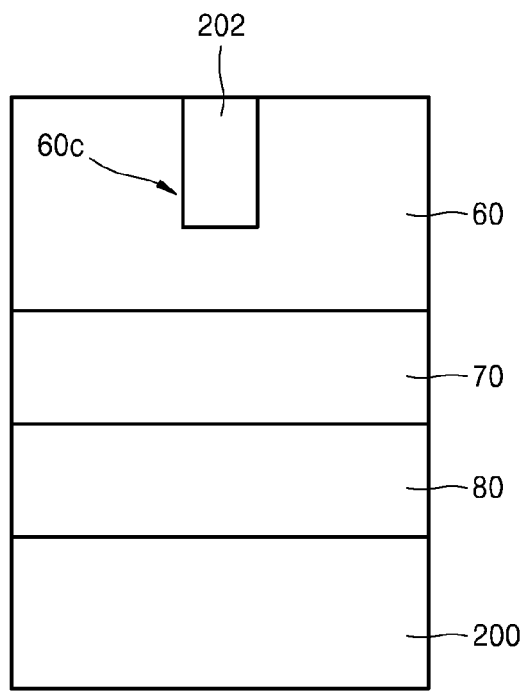

Next, as shown in FIG. 27, the first trench 60c of the low refractive index layer 60 is filled with a first high refractive index layer 202. The first high refractive index layer 202 may be used to form a beam splitter in an area corresponding to the red sub-pixel R or to the blue sub-pixel B of the above-described image sensor, for example, the first beam splitter 42 or the second beam splitter 44 of FIG. 2. The first high refractive index layer 202 has a higher refractive index than the low refractive index layer 60. An upper surface of the first high refractive index layer 202 is flat and has the same height as an upper surface of the low refractive index layer 60 surrounding the upper surface thereof. The first high refractive index layer 202 may be a $TiO_2$ layer or a $SiN_x$ layer, but is not limited thereto.

Figure 28:
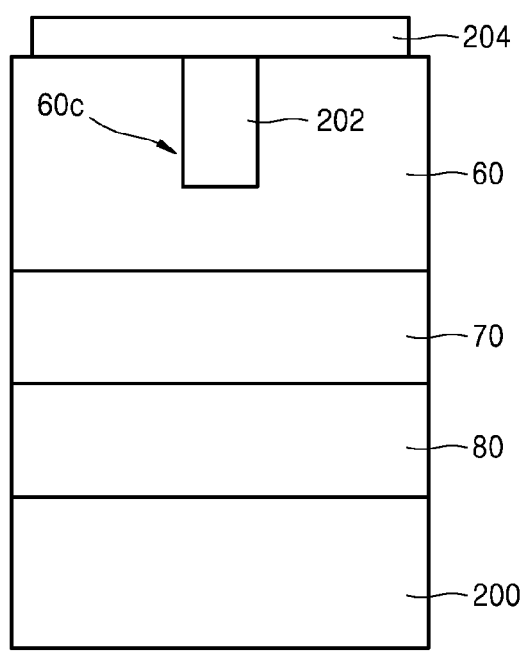

Next, referring to FIG. 28, a lens layer 204 that covers the first high refractive index layer 202 is formed on the upper surface of the low refractive index layer 60. The lens layer 204 may be a micro lens or an etched lens. The lens layer 204 directs the incident light toward the first high refractive index layer 202.

Figure 30:
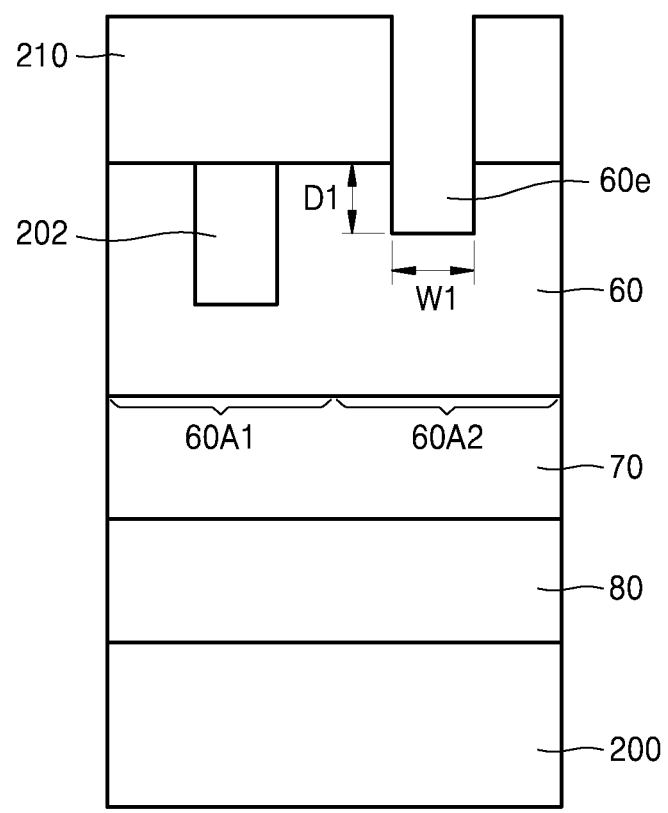

As shown in FIG. 30, the low refractive index layer 60 may be divided into first and second area 60A1 and 60A2. The first area 60A1 may be, for example, an area corresponding to the red sub-pixel R (the R area 60r1 of FIG. 21). Also, the second area 60A2 may be an area corresponding to the blue sub-pixel B (the B area 60b1 of FIG. 21). After the first high refractive index layer 202 is formed in a predetermined area of the first area 60A1, a mask 210, through which a predetermined area of the second area 60A2 is exposed, is formed on the low refractive index layer 60. The upper surface of the first high refractive index layer 202 and an upper surface of the first area 60A1 are completely covered by the mask 210. After the mask 210 is formed, a third trench 60e is formed in the exposed predetermined area of the second area 60A2. A width W1 of the third trench 60e may be the same as that of the first trench 60c. However, a depth D1 of the third trench 60e may be different from that of the first trench 60c. For example, the depth D1 of the third trench 60e may be less than that of the first trench 60c. After the third trench 60e is formed, the mask 210 is removed.

Figure 31:
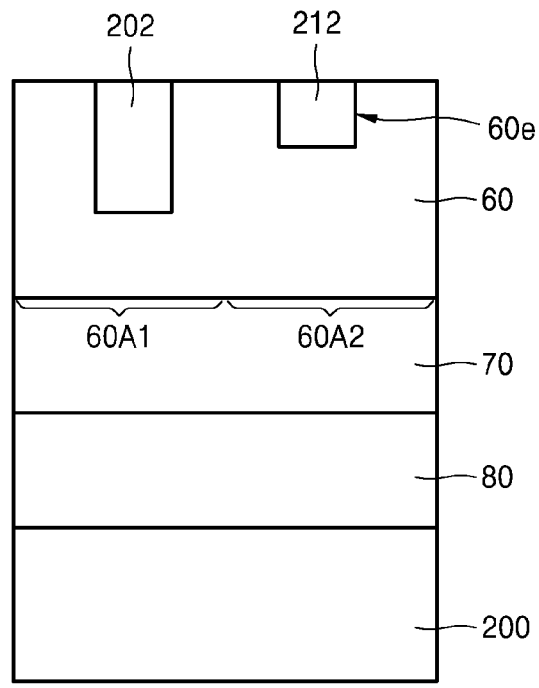

Next, as shown in FIG. 31, the third trench 60e is filled with a second high refractive index layer 212 and an external surface of the second high refractive index layer 212 is planarized. Therefore, an upper surface of the second high refractive index layer 212 has the same height as the upper surface of the low refractive index layer 60 that is surrounding the second high refractive index layer 212. The second high refractive index layer 212 and the first high refractive index layer 202 may be formed by using the same material, but are not limited thereto.

Figure 32:
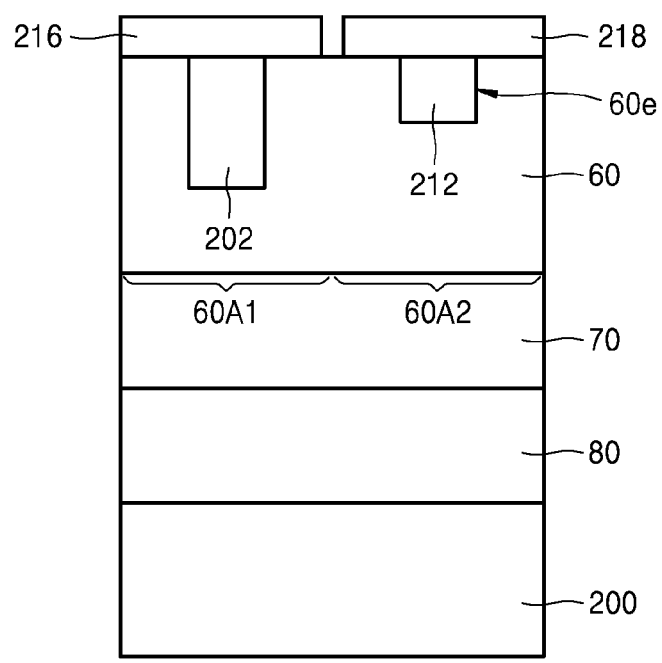

Next, referring to FIG. 32, first and second lens layers 216 and 218 are formed on the low refractive index layer 60. The first and second lens layers 216 and 218 may be separated from each other. The first lens layer 216 is disposed on the first area 60A1 and covers the first high refractive index layer 202. The second lens layer 218 is disposed on the second area 60A2 and covers the second high refractive index layer 212. The first and second lens layers 216 and 218 may be micro lenses or etched lenses.

The first and second high refractive index layers 202 and 212 may be formed to respectively correspond to the first and second extending beam splitters 132 and 134 shown in FIG. 19 or 20. In this case, the first and second lens layers 216 and 218 may be replaced with a single lens layer that covers the first and second high refractive index layers 202 and 212.

In the above-described manufacturing method, the low refractive index layer 60 may be formed as multiple layers.

Figure 33:
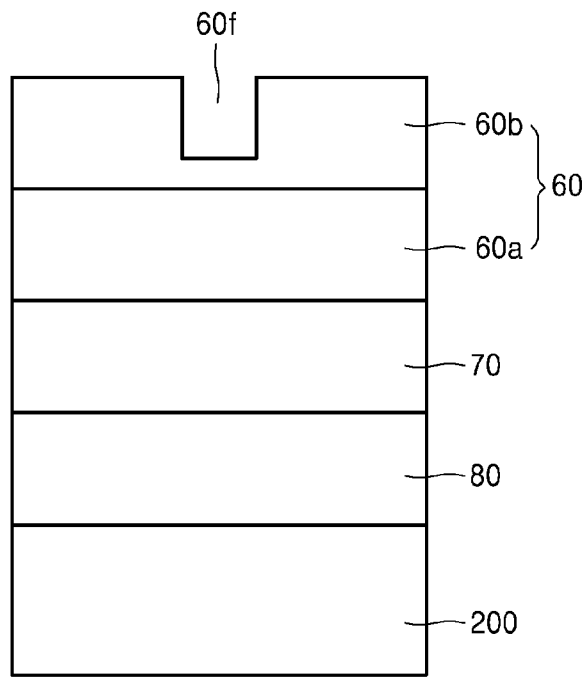

For example, as shown in FIG. 33, the first low refractive index layer 60a, which is transparent to the incident light, may be formed on the color filter layer 70. The first low refractive index layer 60a may be, for example, a SiO2 layer, but is not limited thereto. The second low refractive index layer 60b may be formed on the first low refractive index layer 60a. The second low refractive index layer 60b may be transparent to the incident light. Also, the second low refractive index layer 60b may be formed of a material having a surface which is easily planarized. The second low refractive index layer 60b may be, for example, a polymer layer. The first and second low refractive index layers 60a and 60b may have difference refractive indexes. After the second low refractive index layer 60b is formed, a fourth trench 60f is formed in the second low refractive index layer 60b. The fourth trench 60f is an area filled with a high refractive index layer that is used as a beam splitter in the following processes. Therefore, specifications (for example, depth and width) of the fourth trench 60f may vary according to the area in which the fourth trench 60f is disposed. For example, if an area in which the fourth trench 60f is formed is an area corresponding to the red sub-pixel R, the fourth trench 60f may have specifications which enable the fourth trench 60f to refract or diffract light beams other than red light beams, for example, blue and green light beams, into areas corresponding to the blue and green sub-pixels B and G that are near to the area corresponding to the red sub-pixel R. Also, the operations of FIG. 32 may be applied to the second low refractive index layer 60b of FIG. 30. Therefore, a trench that is the same as or different from the fourth trench 60f may be additionally formed in the second low refractive index layer 60b.

Figure 34:
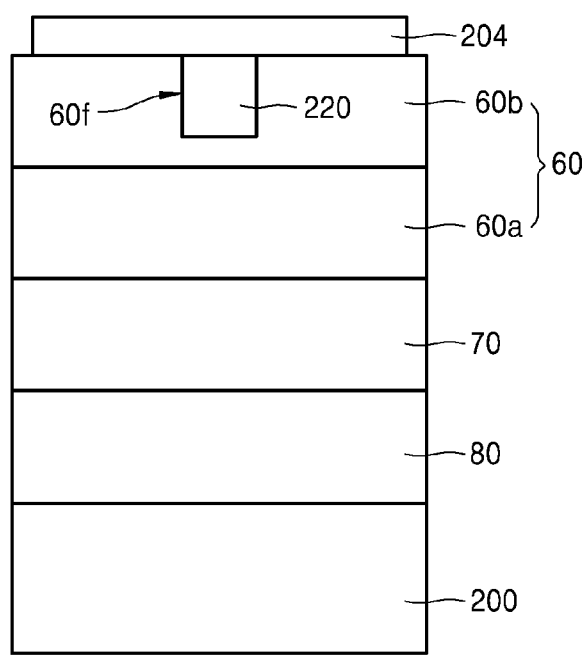

Next, referring to FIG. 34, after the fourth trench 60f is formed in the second low refractive index layer 60b, the fourth trench 60f is filled with the third high refractive index layer 220, and an upper surface of the third high refractive index layer 220 may be planarized to have the same height as an upper surface of the second low refractive index layer 60b. A refractive index of the third high refractive index layer 220 is greater than refractive indexes of the first and second low refractive index layers 60a and 60b. The third high refractive index layer 220 may be used as the above-described beam splitter provided in the red sub-pixel R or the blue sub-pixel B. The lens layer 204 that covers the third high refractive index layer 220 is formed on the second low refractive index layer 60b.

Figure 35:
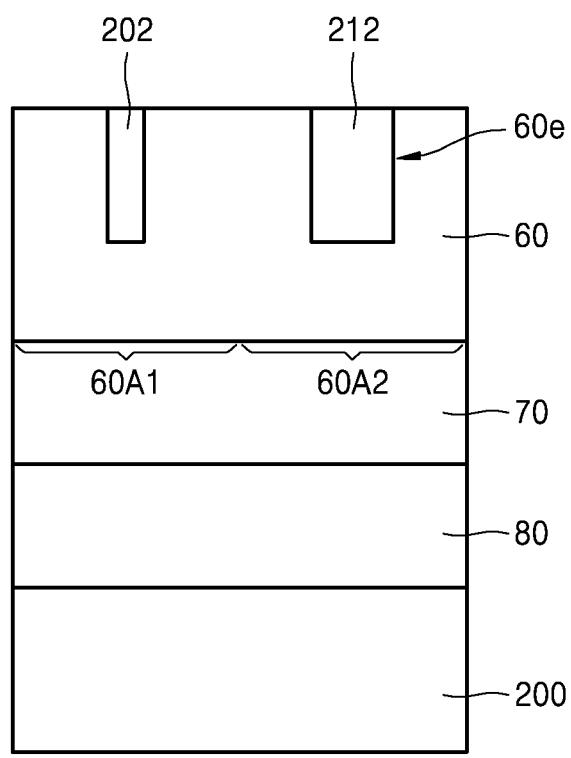

The first and second high refractive index layers 202 and 212 that are formed in the low refractive index layer 60 in FIG. 31 may have the same height and different widths, as shown in FIG. 35.

According to one or more exemplary embodiments, an image sensor includes a beam splitter that changes an irradiance distribution or an intensity distribution of light that is incident on a color filter. Due to the beam splitter, in light incident on at least an R area and B area of a pixel, irradiances or intensities of red light and blue light are higher than those of an image sensor of the related art. Due to the beam splitter, the color filter absorbs less light and thus light efficiency increases. Therefore, it is possible to reduce artifacts that are generated due to a reproduction of color images, and thus improve image quality.

Also, as described above, since at least the irradiances or intensities of red light and blue light are increased by the beam splitter, color purity is improved, and thus vivid colors may be produced.

Furthermore, if the color filter is compatible, color purity is greatly improved, and thus, color reproducibility may also be improved. With regard to the structure, a thickness of the color filter may be reduced because irradiance distributions or intensity distributions of at least red light and blue light are adjusted by the beam splitter before light is incident on the color filter.

It should be understood that the exemplary embodiments described herein should be considered in a descriptive sense only and not for purposes of limitation. Descriptions of features or aspects within each embodiment should typically be considered as available for other similar features or aspects in other embodiments.

While one or more exemplary embodiments have been described with reference to the figures, it will be understood by those of ordinary skill in the art that various changes in form and details may be made therein without departing from the spirit and scope of the present disclosure as defined by the following claims.

What is claimed is:

1. An image sensor comprising:
   a photoelectric conversion layer;
   a color filter disposed on the photoelectric conversion layer;
   a low refractive index layer disposed on the color filter;
   a beam splitter disposed within the low refractive index layer; and
   a lens layer disposed on the low refractive index layer and covering the beam splitter,
   wherein the beam splitter extends in a diagonal direction of a pixel area of the color filter, in a plan view.

2. The image sensor of claim 1, wherein, in each unit pixel of the image sensor, the beam splitter comprises a first beam splitter disposed within a red sub-pixel of a unit pixel of the image sensor and extending in a diagonal direction of the red sub-pixel and a second beam splitter disposed within a blue sub-pixel of the unit pixel of the image sensor and extending in a diagonal direction of the blue sub-pixel.

3. The image sensor of claim 2, wherein each unit pixel of the image sensor comprises the first beam splitter formed in an area of the low refractive index layer corresponding to the red sub-pixel and the second beam splitter formed in an area of the low refractive index layer corresponding to the blue sub-pixel.

4. The image sensor of claim 3, wherein the first beam splitter comprises a first high refractive index portion disposed in the area of the low refractive index layer corresponding to the red sub-pixel and the second beam splitter comprises a second high refractive index portion disposed in the area of the low refractive index layer corresponding to the blue sub-pixel, and
   refractive indexes of the first high refractive index portion and the second high refractive index portion are higher than a refractive index of the low refractive index layer.

5. The image sensor of claim 3, wherein the first beam splitter comprises two first beam splitters each comprising a first high refractive index portion disposed in the area of the low refractive index layer corresponding to the red sub-pixel and the second beam splitter comprises two second beam splitters each comprising a second high refractive index portion disposed in the area corresponding to the blue sub-pixel, and
   refractive indexes of the first high refractive index portion and the second high refractive index portion are higher than a refractive index of the low refractive index layer.

6. The image sensor of claim 4, wherein at least one of a height, a width, and a refractive index of the first high refractive index portion disposed in the area corresponding to the red sub-pixel is different from a height, a width, and a refractive index, respectively, of the second high refractive index portion disposed in the area corresponding to the blue sub-pixel.

7. The image sensor of claim 5, wherein a height, a width, and a refractive index of the two first high refractive index portions in the area corresponding to the red sub-pixel are identical to each other, and a height, a width, and a refractive index of the two second high refractive index portions disposed in the area corresponding to the blue sub-pixel are identical to each other.

8. The image sensor of claim 7, wherein the at least one of the height, the width, and the refractive index of the two first high refractive index portions disposed in the area corresponding to the red sub-pixel are different from at least one of the height, the width, and the refractive index, respectively, of the two second high refractive index portions disposed in the area corresponding to the blue sub-pixel.

9. The image sensor of claim 2, wherein the color filter includes no portion corresponding to a green sub-pixel.

10. The image sensor of claim 4, wherein each unit pixel of the image sensor further comprises a third beam splitter comprising a third high refractive index portion disposed in an area of the low refractive index layer corresponding to a green sub-pixel.

11. The image sensor of claim 10, wherein the color filter includes no portion corresponding to the green sub-pixel.

12. The image sensor of claim 2, wherein the first beam splitter and the second beam splitter extend from the red sub-pixel and the blue sub-pixel, respectively, and into at least one green sub-pixel.

13. The image sensor of claim 2, wherein the red sub-pixel and the blue sub-pixel in each unit pixel are covered by a single lens layer.

14. The image sensor of claim 1, wherein the low refractive index layer comprises a first low refractive index layer disposed on the color filter and a second low refractive index layer disposed on the first low refractive index layer, and wherein the beam splitter is disposed within the second low refractive index layer.

15. An image sensor comprising:
    a unit pixel comprising a red sub-pixel, a green sub-pixel, and a blue sub-pixel arranged in a Bayer pattern;
    at least one first beam splitter disposed in an area corresponding to the red sub-pixel and extending in a diagonal direction of the red sub-pixel, in a plan view; and
    at least one second beam splitter disposed in an area corresponding to the blue sub-pixel and extending in a diagonal direction of the blue sub-pixel, in a plan view.

16. The image sensor of claim 15, wherein the at least one first beam splitter comprises one or two first beam splitters and the at least one second beam splitter comprises one or two second beam splitters.

17. The image sensor of claim 15, wherein the at least one first beam splitter extends into an area corresponding to the green sub-pixel, and wherein the at least one second beam splitter extends into an area corresponding to the green sub-pixel.

18. The image sensor of claim 15, further comprising at least one third beam splitter disposed in an area corresponding to the green sub-pixel.

19. A method of manufacturing an image sensor, the method comprising:
    forming a low refractive index layer on a lower layer, the lower layer comprising a color filter;
    forming a beam splitter in the low refractive index layer; and
    forming a lens layer covering the beam splitter, on the low refractive index layer,
    wherein the beam splitter extends in a diagonal direction of a pixel area of the color filter, in a plan view.

20. The method of claim 19, wherein the forming the low refractive index layer comprises:
    forming a first low refractive index layer on the lower layer; and
    forming a second low refractive index layer on the first low refractive index layer.

21. The method of claim 19, wherein the forming the beam splitter in the low refractive index layer comprises:

forming at least one trench in the low refractive index layer; and filling the at least one trench with a high refractive index layer that has a higher refractive index than the low refractive index layer.

22. The method of claim 21, wherein the forming the at least one trench comprises forming at least one first trench in an area of the low refractive index layer corresponding to a red sub-pixel of a unit pixel of the image sensor, and forming at least one second trench in an area of the low refractive index layer corresponding to a blue sub-pixel of the unit pixel of the image sensor; and the at least one first trench extends in a diagonal direction of the red sub-pixel, in the plan view, and the at least one second trench extends in a diagonal direction of the blue sub-pixel, in the plan view.

23. The method of claim 22, wherein the at least one first trench comprises one or two first trenches and the at least one second trench comprises one or two second trenches.

24. The method of claim 23, wherein at least one of a height, a width, and a number of the at least one first trench is different from at least one of a height, a width, and a number, respectively, of the at least one second trench.

25. The method of claim 23, wherein the forming the at least one trench further comprises forming at least one third trench in an area of the low refractive index layer corresponding to a green sub-pixel of the unit pixel.

26. The method of claim 25, wherein the color filter includes no portion corresponding to the green sub-pixel.

27. The method of claim 22, wherein the at least one first trench and the at least one second trench extend from the area of the low refractive index layer which corresponds to the red sub-pixel and the blue sub-pixel, respectively, into an area of the low refractive index layer corresponding to a green sub-of the unit pixel.

* * * * *